(12) United States Patent
Kaneyama et al.

(10) Patent No.: US 8,540,824 B2
(45) Date of Patent: *Sep. 24, 2013

(54) SUBSTRATE PROCESSING METHOD

(75) Inventors: Koji Kaneyama, Kamigyo-ku (JP);
Masashi Kanaoka, Kamigyo-ku (JP);
Tadashi Miyagi, Kamigyo-ku (JP);
Kazuhito Shigemori, Kamigyo-ku (JP);
Shuichi Yasuda, Kamigyo-ku (JP)

(73) Assignee: Sokudo Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/813,251

(22) Filed: Jun. 10, 2010

(65) Prior Publication Data

US 2010/0239986 A1    Sep. 23, 2010

Related U.S. Application Data

(62) Division of application No. 11/534,293, filed on Sep. 22, 2006, now abandoned.

(30) Foreign Application Priority Data

Sep. 25, 2005    (JP) .................................. 2005-281600

(51) Int. Cl.
| | |
|---|---|
| *B08B 3/00* | (2006.01) |
| *H01L 21/31* | (2006.01) |
| *G03F 7/00* | (2006.01) |
| *G03F 1/00* | (2012.01) |

(52) U.S. Cl.
USPC ................ 134/26; 134/32; 430/311; 430/330

(58) Field of Classification Search
None
See application file for complete search history.

(56) References Cited

U.S. PATENT DOCUMENTS

| | | | |
|---|---|---|---|
| 3,961,100 | A | 6/1976 | Harris et al. |
| 4,751,170 | A | 6/1988 | Mimura et al. |
| 4,840,874 | A | 6/1989 | Shigemitsu et al. |
| 4,985,722 | A | 1/1991 | Ushijima et al. |
| 5,202,716 | A | 4/1993 | Tateyama et al. |
| 5,339,128 | A | 8/1994 | Tateyama et al. |
| 5,442,416 | A | 8/1995 | Tateyama et al. |

(Continued)

FOREIGN PATENT DOCUMENTS

| | | |
|---|---|---|
| CN | 1385882 A | 12/2002 |
| CN | 1440055 | 9/2003 |

(Continued)

OTHER PUBLICATIONS

Office Actions of JP Application No. 2005-281600, mailed Nov. 24, 2009, 2 pages total.

(Continued)

*Primary Examiner* — Nicole Blan
(74) *Attorney, Agent, or Firm* — Kilpatrick Townsend & Stockton LLP

(57) ABSTRACT

The transporting process from cleaning and drying processing of a substrate in a cleaning/drying processing unit in a cleaning/drying processing group to post-exposure bake (PEB) of the substrate in a thermal processing group for post-exposure bake in a cleaning/drying processing block is described below. First, after the substrate after exposure processing is subjected to the cleaning and drying processing in the cleaning/drying processing group, a sixth central robot takes out the substrate from the cleaning/drying processing group and carries that substrate into the thermal processing group for post-exposure bake in the cleaning/drying processing block.

10 Claims, 14 Drawing Sheets

(56) References Cited

U.S. PATENT DOCUMENTS

| | | | |
|---|---|---|---|
| 5,610,683 A | 3/1997 | Takahashi | |
| 5,788,868 A | 8/1998 | Itaba et al. | |
| 5,792,596 A | 8/1998 | Yasuzato et al. | |
| 6,261,378 B1 | 7/2001 | Hashimoto et al. | |
| 6,319,322 B1* | 11/2001 | Ueda et al. | 118/666 |
| 6,402,400 B1 | 6/2002 | Ueda et al. | |
| 6,402,401 B1 | 6/2002 | Ueda et al. | |
| 6,454,472 B1 | 9/2002 | Kim et al. | |
| 6,471,422 B1 | 10/2002 | Ueda et al. | |
| 6,511,315 B2 | 1/2003 | Hashimoto | |
| 6,558,053 B2 | 5/2003 | Shigemori et al. | |
| 6,585,430 B2 | 7/2003 | Matsuyama et al. | |
| 6,672,779 B2 | 1/2004 | Ueda et al. | |
| 6,824,621 B2 | 11/2004 | Shibagaki | |
| 6,873,938 B1 | 3/2005 | Paxton et al. | |
| 6,893,171 B2 | 5/2005 | Fukutomi et al. | |
| 7,009,148 B2 | 3/2006 | Kawano et al. | |
| 7,294,586 B2 | 11/2007 | Kawano et al. | |
| 7,357,846 B2 | 4/2008 | Fujishima | |
| 7,359,034 B2 | 4/2008 | Ishii | |
| 7,364,376 B2 | 4/2008 | Sugimoto et al. | |
| 7,364,626 B2 | 4/2008 | Hirose et al. | |
| 7,385,674 B2 | 6/2008 | Ishii | |
| 7,387,131 B2 | 6/2008 | Kuroda et al. | |
| 7,497,633 B2 | 3/2009 | Kaneyama et al. | |
| 7,524,771 B2 | 4/2009 | Izumi et al. | |
| 7,604,424 B2 | 10/2009 | Shigemori et al. | |
| 7,658,560 B2 | 2/2010 | Kaneyama et al. | |
| 7,665,916 B2 | 2/2010 | Yamamoto et al. | |
| 7,726,891 B2 | 6/2010 | Kaneyama et al. | |
| 8,034,190 B2 | 10/2011 | Yasuda et al. | |
| 2001/0021486 A1 | 9/2001 | Kitano | |
| 2001/0024767 A1* | 9/2001 | Toshima et al. | 430/313 |
| 2001/0044078 A1 | 11/2001 | Takahata et al. | |
| 2002/0001679 A1 | 1/2002 | Matsuyama et al. | |
| 2002/0029788 A1 | 3/2002 | Verhaverbeke et al. | |
| 2002/0029852 A1 | 3/2002 | Egashira | |
| 2002/0098458 A1 | 7/2002 | Hashimoto | |
| 2002/0160625 A1* | 10/2002 | Inoue et al. | 438/780 |
| 2003/0036293 A1* | 2/2003 | Tanaka et al. | 438/780 |
| 2003/0045131 A1 | 3/2003 | Verbeke et al. | |
| 2003/0046034 A1 | 3/2003 | Kitamoto et al. | |
| 2003/0085195 A1 | 5/2003 | Lee et al. | |
| 2003/0155069 A1 | 8/2003 | Lee et al. | |
| 2003/0172955 A1 | 9/2003 | Kuroda et al. | |
| 2003/0213431 A1* | 11/2003 | Fukutomi et al. | 118/696 |
| 2003/0226577 A1* | 12/2003 | Orll et al. | 134/1.3 |
| 2004/0005149 A1 | 1/2004 | Sugimoto et al. | |
| 2004/0053170 A1 | 3/2004 | Ijima et al. | |
| 2004/0060190 A1* | 4/2004 | Lee | 34/59 |
| 2004/0062861 A1 | 4/2004 | Sato | |
| 2004/0087158 A1 | 5/2004 | Izumi et al. | |
| 2004/0118814 A1 | 6/2004 | Kim et al. | |
| 2004/0182318 A1 | 9/2004 | Hashinoki et al. | |
| 2005/0027387 A1 | 2/2005 | Fujishima | |
| 2005/0046934 A1* | 3/2005 | Ho et al. | 359/380 |
| 2005/0069819 A1 | 3/2005 | Shiobara | |
| 2005/0075819 A1 | 4/2005 | Paxton et al. | |
| 2005/0176254 A1 | 8/2005 | Takeishi et al. | |
| 2005/0221234 A1 | 10/2005 | Ito | |
| 2005/0225738 A1 | 10/2005 | Shirai | |
| 2005/0287821 A1 | 12/2005 | Higashi et al. | |
| 2006/0017903 A1 | 1/2006 | Bleeker et al. | |
| 2006/0061747 A1 | 3/2006 | Ishii | |
| 2006/0098978 A1 | 5/2006 | Yasuda et al. | |
| 2006/0098979 A1 | 5/2006 | Kaneyama et al. | |
| 2006/0103818 A1* | 5/2006 | Holmes et al. | 355/53 |
| 2006/0104635 A1 | 5/2006 | Kaneyama et al. | |
| 2006/0141400 A1* | 6/2006 | Hirayama et al. | 430/395 |
| 2006/0147201 A1 | 7/2006 | Asano et al. | |
| 2006/0147202 A1 | 7/2006 | Yasuda et al. | |
| 2006/0152693 A1 | 7/2006 | Yasuda et al. | |
| 2006/0152694 A1 | 7/2006 | Yasuda et al. | |
| 2006/0152698 A1 | 7/2006 | Ishii | |
| 2006/0159449 A1 | 7/2006 | Yasuda et al. | |
| 2006/0164613 A1 | 7/2006 | Akimoto et al. | |
| 2006/0256316 A1 | 11/2006 | Tanno et al. | |
| 2006/0291854 A1 | 12/2006 | Kaneyama et al. | |
| 2007/0003278 A1 | 1/2007 | Kaneyama | |
| 2007/0031755 A1* | 2/2007 | Hirayama et al. | 430/270.1 |
| 2007/0052942 A1 | 3/2007 | Tanno et al. | |
| 2007/0071439 A1 | 3/2007 | Kaneyama et al. | |
| 2007/0122551 A1 | 5/2007 | Yamamoto et al. | |
| 2007/0134593 A1 | 6/2007 | Hirayama et al. | |
| 2007/0177869 A1* | 8/2007 | Yamamoto et al. | 396/611 |
| 2007/0293974 A1 | 12/2007 | Kitamoto et al. | |
| 2007/0294058 A1 | 12/2007 | Kitamoto et al. | |
| 2008/0020315 A1 | 1/2008 | Higashi et al. | |
| 2008/0064226 A1 | 3/2008 | Kawano et al. | |
| 2009/0004607 A1 | 1/2009 | Shimoaoki et al. | |
| 2009/0073394 A1 | 3/2009 | Miyagi et al. | |
| 2010/0129526 A1 | 5/2010 | Yasuda et al. | |
| 2010/0136257 A1 | 6/2010 | Yasuda et al. | |
| 2010/0136492 A1 | 6/2010 | Yasuda et al. | |
| 2010/0190116 A1 | 7/2010 | Kaneyama et al. | |

FOREIGN PATENT DOCUMENTS

| | | |
|---|---|---|
| CN | 1455438 | 11/2003 |
| CN | 1926662 A | 7/2007 |
| EP | 0 605 103 A1 | 7/1994 |
| JP | 59-011628 A | 1/1984 |
| JP | 05-178416 A | 7/1993 |
| JP | 06-124873 A | 5/1994 |
| JP | 06-151293 A | 5/1994 |
| JP | 08-191046 A | 7/1996 |
| JP | 08-222513 A | 8/1996 |
| JP | 08-314156 A | 11/1996 |
| JP | 09-074126 A | 3/1997 |
| JP | 09-074127 A | 3/1997 |
| JP | 10-041261 A | 2/1998 |
| JP | 10-057872 A | 3/1998 |
| JP | 11-106042 A | 4/1999 |
| JP | 11-145246 A | 5/1999 |
| JP | 11-233480 A | 8/1999 |
| JP | 11-260686 A | 9/1999 |
| JP | 11-274265 A | 10/1999 |
| JP | 2000-252187 A | 9/2000 |
| JP | 2000-340544 A | 12/2000 |
| JP | 2001-203143 A | 7/2001 |
| JP | 2001-319856 A | 11/2001 |
| JP | 2002-086046 A | 3/2002 |
| JP | 2002-198347 A | 7/2002 |
| JP | 2002-217267 A | 8/2002 |
| JP | 2002-273360 A | 9/2002 |
| JP | 3337677 | 10/2002 |
| JP | 2003-007663 A | 1/2003 |
| JP | 2003-086479 A | 3/2003 |
| JP | 2003-092283 A | 3/2003 |
| JP | 2003-093943 A | 4/2003 |
| JP | 2003-205265 A | 7/2003 |
| JP | 2003-324139 A | 11/2003 |
| JP | 2004-015023 A | 1/2004 |
| JP | 2004-055766 A | 2/2004 |
| JP | 2004-087795 A | 3/2004 |
| JP | 2004-134674 A | 4/2004 |
| JP | 2004-193597 A | 7/2004 |
| JP | 2004-214587 A | 7/2004 |
| JP | 2004-228594 A | 8/2004 |
| JP | 2004-273894 A | 9/2004 |
| JP | 2004-274069 A | 9/2004 |
| JP | 2004-319767 A | 11/2004 |
| JP | 2004-342654 A | 12/2004 |
| JP | 2005-109146 A | 4/2005 |
| JP | 2005-197469 A | 7/2005 |
| JP | 2005-203563 A | 7/2005 |
| JP | 2005-294520 A | 10/2005 |
| JP | 2006-024684 A | 1/2006 |
| JP | 2006-049757 A | 2/2006 |
| JP | 2006-080403 A | 3/2006 |
| KR | 1999-0045297 A | 6/1999 |
| WO | WO 99/49504 | 9/1999 |
| WO | WO 99/49504 A1 | 9/1999 |
| WO | WO 2004/053956 A | 6/2004 |
| WO | WO 2004/053959 A1 | 6/2004 |

| | | | |
|---|---|---|---|
| WO | WO 2004074937 A1 * | 9/2004 | |
| WO | WO 2004/102646 A1 | 11/2004 | |
| WO | WO 2005015627 A1 * | 2/2005 | |
| WO | WO 2005019937 A1 * | 3/2005 | |
| WO | WO 2005/036623 A | 4/2005 | |
| WO | WO 2005101467 A1 * | 10/2005 | |

OTHER PUBLICATIONS

Office Action of Japanese Application No. 2005-281600, mailed Jul. 13, 2010, 2 pages total.

Prior art citations of granted Chinese Application No. 200510129566.5, issued Jul. 29, 2009, 1 page.

Office Action of KR Application No. 2005-116311, mailed Oct. 28, 2006, 8 pages. (English Translation Included).

Prior art citations of granted Chinese Application No. 2005-10120440.1, issued Jun. 23, 2010, 1 page.

Non-Final Office Action for U.S. Appl. No. 12/698,862 mailed on Oct. 6, 2011, 15 pages.

Non-Final Office Action for U.S. Appl. No. 12/719,788 mailed on Dec. 9, 2010, 18 pages.

Notice of Allowance for U.S. Appl. No. 12/719,788 mailed on Jun. 6, 2011, 9 pages.

Non-Final Office Action for U.S. Appl. No. 12/698,870 mailed on Feb. 14, 2011, 19 pages.

Final Office Action for U.S. Appl. No. 12/698,870 mailed on Jun. 2, 2011, 19 pages.

Non-Final Office Action for U.S. Appl. No. 12/698,870 mailed on Sep. 14, 2011, 29 pages.

Non-Final Office Action for U.S. Appl. No. 12/754,872 mailed on Sep. 28, 2010, 20 pages.

Final Office Action for U.S. Appl. No. 12/754,872 mailed on Mar. 17, 2011, 23 pages.

Non-Final Office Action for U.S. Appl. No. 12/754,872 mailed on Jul. 28, 2011, 22 pages.

Notice of Allowance for U.S. Appl. No. 12/754,872 mailed on Nov. 16, 2011, 9 pages.

Final Office Action for U.S. Appl. No. 12/698,870 mailed on Feb. 8, 2012, 31 pages.

Non-Final Office Action for U.S. Appl. No. 12/698,876 mailed Aug. 19, 2011, 5 pages.

Final Office Action for U.S. Appl. No. 12/698,876 mailed Dec. 9, 2011, 6 pages.

Final Office Action for U.S. Appl. No. 12/698,862 mailed Mar. 13, 2012, 15 pages.

Non-Final Office Action for U.S. Appl. No. 12/754,872 mailed Feb. 22, 2012, 38 pages.

Non-Final Office Action for U.S. Appl. No. 12/698,862 mailed Jul. 20, 2012, 16 pages.

Non-Final Office Action for U.S. Appl. No. 12/698,870 mailed May 24, 2012, 36 pages.

Final Office Action for U.S. Appl. No. 12/754,872 mailed Jul. 23, 2012, 41 pages.

Decision to Grant a Patent for the counterpart Japanese patent application No. 2005-267331 dated Dec. 4, 2012, 3 pages.

Final Office Action for U.S. Appl. No. 12/698,862 mailed on Feb. 20, 2013, 18 pages.

Non-Final Office Action for U.S. Appl. No. 12/698,870 mailed on Oct. 29, 2012, 27 pages.

Non-Final Office Action for U.S. Appl. No. 12/754,872 mailed on Oct. 29, 2012, 25 pages.

Non-Final Office Action for U.S. Appl. No. 12/698,870 mailed on Mar. 6, 2013, 41 pages.

Notice of Allowance for U.S. Appl. No. 12/754,872 mailed on Mar. 12, 2013, 12 pages.

Non-Final Office Action for U.S. Appl. No. 12/698,862 mailed on Jun. 21, 2013, 19 pages.

Non-Final Office Action for U.S. Appl. No. 12/698,876 mailed on Jun. 26, 2013, 7 pages.

* cited by examiner

F I G. 9
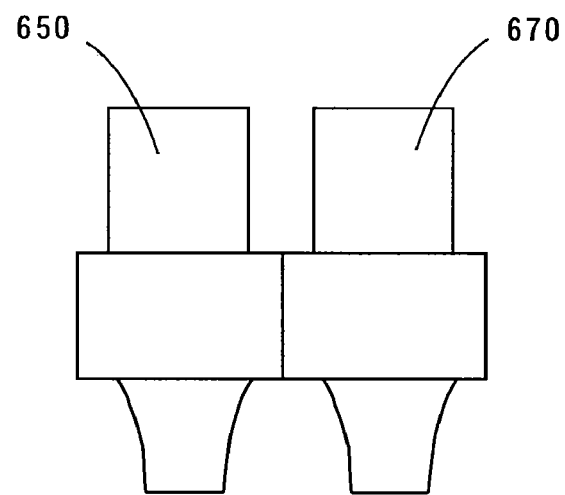

F I G. 1 0
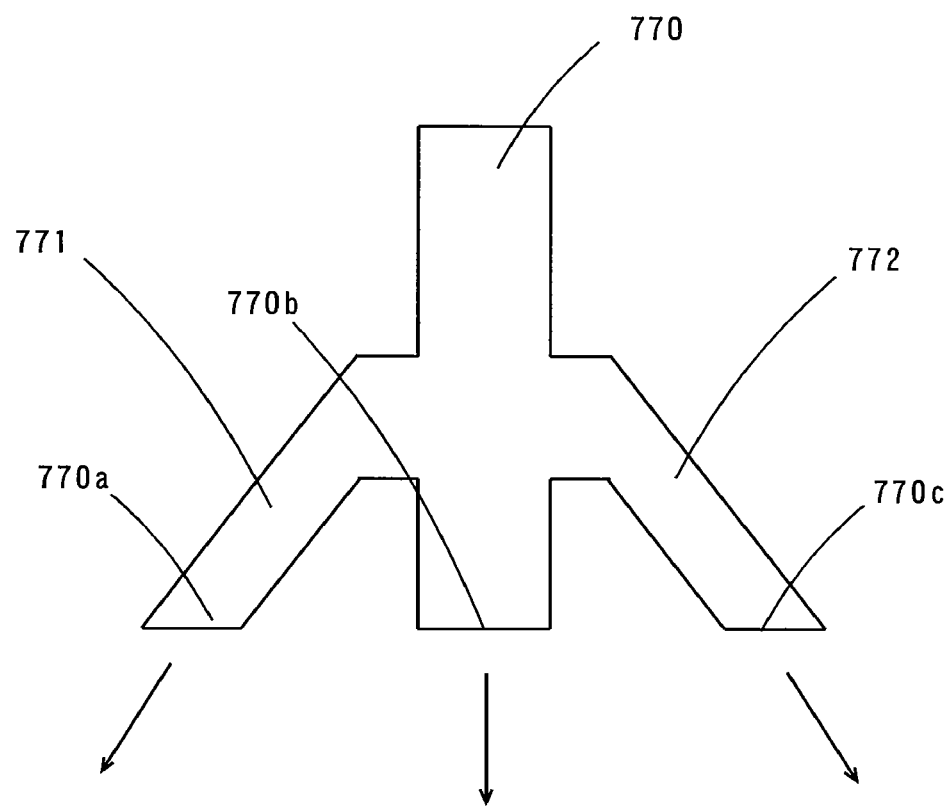

F I G. 1 2
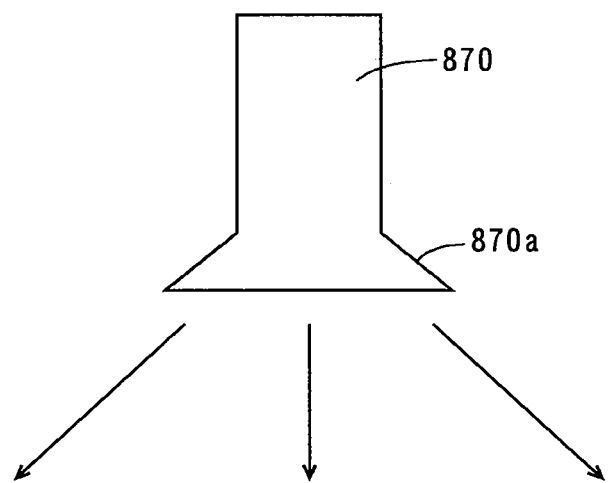

F I G. 1 4
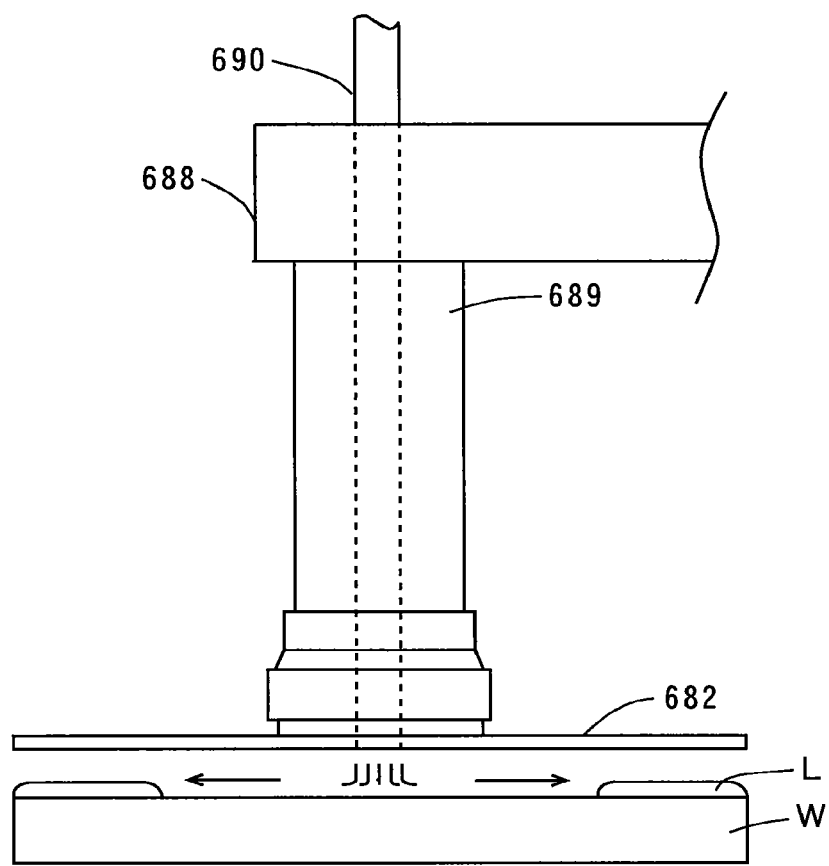

SUBSTRATE PROCESSING METHOD

CROSS-REFERENCES TO RELATED APPLICATIONS

This application is a division of U.S. patent application Ser. No. 11/534,293, filed Sep. 22, 2006, now abandoned, which claims priority to Japanese Patent Application No. 2005-281600, filed Sep. 28, 2005. The disclosures of Ser. No. 11/534,293 and JP 2005-281600 are hereby incorporated by reference in their entirety for all purposes.

FIELD OF THE INVENTION

The present invention relates to a substrate processing apparatus for applying processing to substrates.

BACKGROUND OF THE INVENTION

A substrate processing apparatus is used to apply a variety of processing to substrates such as semiconductor substrates, substrates for use in liquid crystal displays, plasma displays, optical disks, magnetic disks, magneto-optical disks, photomasks, and other substrates. Such a substrate processing apparatus typically applies a plurality of successive processing to a single substrate.

The substrate processing apparatus as described in JP 2003-324139 A includes an indexer block, an anti-reflection film processing block, a resist film processing block, a development processing block, and an interface block. An exposure device is arranged adjacent to the interface block as an external device separate from the substrate processing apparatus.

The indexer block takes out a substrate from a cassette for storing substrates in multiple stages and stores a substrate into the cassette, and the anti-reflection film processing block forms an anti-reflection film under a photoresist film to reduce possible standing waves and halation generated during exposure processing.

The resist film processing block forms the photoresist film on the anti-reflection film, and the development processing block applies development processing to the substrate after exposure processing. Specifically, this development processing block includes a development processing group that applies the development processing to the substrate after the exposure processing and an after-mentioned thermal processing group for development that applies thermal processing to the substrate related to that development processing.

In the above-described substrate processing apparatus, a substrate is carried from the indexer block into the anti-reflection film processing block and the resist film processing block, where the formation of an anti-reflection film and resist film coating processing are applied to the substrate respectively. The substrate is then transported to the exposure device through the interface block.

After exposure processing has been applied to the resist film on the substrate by this exposure device, the substrate is transported to the development processing block through the interface block. In the development processing block, development processing is applied to the resist film on the substrate to form a resist pattern thereon, and the substrate is subsequently carried into the indexer block.

With recent improvements in the density and integration of devices, making finer resist patterns have become very important. Conventional exposure devices typically perform exposure processing by providing reduction projection of a reticle pattern on a substrate through a projection lens.

With the conventional exposure devices, however, the line width of an exposure pattern is determined by the wavelength of the light source of an exposure device, thus making it impossible to make a resist pattern finer than that.

For this reason, a liquid immersion method is suggested as a projection exposure method allowing for finer exposure patterns (refer to, e.g., WO99/49504 pamphlet). In the projection exposure device according to the WO99/49504 pamphlet, a liquid is filled between a projection optical system and a substrate, resulting in a shorter wavelength of exposure light on a main surface of the substrate. This allows for a finer exposure pattern.

With respect to the above-described conventional exposure device, however, since the exposure processing is performed with the substrate in contact with a liquid, the substrate with the liquid adhering is carried from the exposure device. As a result, the liquid adhering to the substrate carried out of the exposure device may drop in the substrate processing apparatus, causing operational troubles such as abnormalities in the electric system of the substrate processing apparatus.

SUMMARY OF THE INVENTION

It is an object of the invention to provide a substrate processing apparatus capable of preventing a liquid adhering to a substrate in an exposure device from causing operational troubles.

A substrate processing apparatus according to one aspect of the invention that is arranged adjacent to an exposure device includes a processing section for applying processing to a substrate, and an interface that is provided adjacent to an end of the processing section, wherein the interface includes a first transport device that transports the substrate between the processing section and the exposure device, the processing section includes a drying processing unit that is provided adjacent to the interface for applying drying processing to the substrate, a thermal processing unit that applies thermal processing to the substrate and a second transport device that transports the substrate, wherein the first transport device transports the substrate to exposure processing is applied by the exposure device to the drying processing unit, and the second transport device transports the substrate to which processing is applied by the drying processing unit to the thermal processing unit.

In the substrate processing apparatus, the processing section applies the processing to the substrate. The substrate is transported between the processing section and the exposure device by the first transport device of the interface.

Furthermore, the substrate subjected to the exposure processing by the exposure device is transported to the drying processing unit adjacent to the interface by the first transport device, and the substrate subjected to the processing by the drying processing unit is transported to the thermal processing unit by the second transport device.

In such a way, the substrate after the exposure processing is transported to the thermal processing unit after drying by the drying processing unit of the processing section. This prevents a liquid from dropping in the substrate processing apparatus, even if the liquid adheres to the substrate in the exposure device. Thus, operational troubles of the substrate processing apparatus can be avoided.

In addition, in the substrate processing apparatus according to the present invention, after the drying processing is applied to the substrate after the exposure processing by the drying processing unit, the second transport device carries that substrate into the thermal processing unit.

In this way, the substrate is carried into the thermal processing unit immediately after the drying processing, thereby making it possible to minimize a post expose delay time from the end of the exposure processing to the initiation of the thermal processing. This makes it possible to apply the thermal processing to the substrate after the exposure processing at an early stage. Thus, it is possible to avoid oxidation of the substrate after the exposure processing.

The dying processing unit may further clean the substrate before the drying processing. In this case, even if particles and the like in the atmosphere is attached to the substrate when the substrate to which a liquid has adhered during the exposure processing is transported from the exposure device to the drying processing unit, the attachment can be reliably removed. This makes it possible to prevent processing defects.

The interface may further include a platform on which the substrate is temporarily placed, the platform may include a temperature control waiting unit that makes the substrate wait until the following step is ready while keeping the substrate at a predetermined temperature.

In this case, the temperature control waiting unit has the function of keeping the substrate at the predetermined temperature and the function of making the substrate wait until the following step is ready, thereby making it possible to omit a typical process of transporting the substrate to a substrate platform in which the substrate waits until the following step is ready. This can improve throughput and reliability since one of access points for transport is omitted.

The interface that is provided between the processing section and the exposure device may exchange the substrate through the temperature control waiting unit between the processing section and the exposure device.

In this case, that substrate is kept at the predetermined temperature and made to wait by the temperature control waiting unit until the following step is ready, thereby making it possible to omit the typical process of transporting the substrate to the substrate platform in which the substrate is made to wait until the exposure processing is ready. This can improve the throughput and the reliability since one of the access points for transport is omitted.

In this way, when the exposure processing is performed by, for example, a liquid immersion method in which strict temperature control of the substrate is required, it is possible to perform that exposure processing in good conditions by omitting the transporting process.

The temperature control waiting unit may be used for transferring the substrate before the exposure processing from the processing section to the exposure device, and the substrate processing apparatus may further include a substrate platform on which the substrate is temporarily placed when the substrate after the exposure processing is transferred from the exposure device to the processing section.

In this case, the temperature control waiting unit is used for transferring the substrate before the exposure processing from the processing section to the exposure device, and the substrate platform is used for temporary placement of the substrate when the substrate after the exposure processing is transferred from the exposure device to the processing section.

In this way, the temperature control waiting unit is used for the temperature control and waiting of the substrate before the exposure processing in which the strict temperature control is required, thereby making it possible to realize the improvement of the throughput and perform the exposure processing in good conditions. In addition, provision of the substrate platform enables the substrate to be temporarily placed on the substrate platform when the following step in the processing section is not ready after the exposure processing.

The predetermined temperature may be substantially equal to a temperature in the exposure device. This makes it possible to apply the exposure processing in good conditions to the substrate having substantially the same temperature as that in the exposure device.

The processing section may include a photosensitive film formation unit that forms a photosensitive film made of a photosensitive material on the substrate before the exposure processing and a hydrophobic processing unit that applies hydrophobic processing to the substrate after the formation of the photosensitive film by the photosensitive film formation unit and before the exposure processing.

In this case, the photosensitive film formation unit forms the photosensitive film on the substrate and the hydrophobic processing unit applies the hydrophobic processing to the substrate on which the photosensitive film is formed. The substrate to which the hydrophobic processing is applied is subjected to the exposure processing by the exposure device.

In this way, since the hydrophobic processing is applied to the substrate by the hydrophobic processing unit before the exposure processing, a liquid is preventing from soaking into the film on the substrate during the exposure processing by the exposure device. This can prevent the generation of pattern defects and a decrease in yield on the substrate.

The processing section may further include a protective film formation unit that forms a protective film for protecting the photosensitive film, and the hydrophobic processing unit may apply the hydrophobic processing to the protective film formed by the protective film formation unit.

In this case, even if the exposure processing is performed by the exposure device with the substrate in contact with a liquid, the component of the photosensitive material is prevented from being eluted in the liquid and the liquid is prevented from soaking into the photosensitive film and the protective film on the substrate. This can prevent the generation of pattern defects and a decrease in yield on the substrate.

The processing section may further include a removal unit that removes the protective film after the exposure processing. In this case, the protective film formed on the photosensitive film can be reliably removed.

The first transport device may include first and second holders that hold the substrate, the first holder may hold the substrate when the substrate before the exposure processing is transported and the second holder may hold the substrate when the substrate after the exposure processing is transported.

In this case, the second holder is used for transporting the substrate with a liquid adhering during the exposure processing and the first holder is used for transporting the substrate with no liquid adhering before the exposure processing. Accordingly, the liquid can be prevented from adhering to the first holder. This can prevent the liquid from adhering to the substrate before the exposure processing. Thus, the particles and the like in the atmosphere can be reliably prevented from adhering to the substrate before the exposure processing.

The second holder may be provided below the first holder. In this case, even if a liquid drops from the second holder and the substrate held thereby, the liquid is prevented from adhering to the first holder and the substrate held thereby. This can reliably prevent particles and the like from adhering to the substrate before the exposure processing.

The processing section may include a development processing unit that applies development processing to the substrate. In this case, the development processing is applied to the substrate by the development processing unit.

The processing section may further include an anti-reflection film formation unit that forms an anti-reflection film on the substrate before the formation of the photosensitive film by the photosensitive film formation unit.

In this case, since the anti-reflection film is formed on the substrate, the possible standing waves and halation generated during the exposure processing can be reduced. This can prevent the generation of pattern defects and a decrease in yield on the substrate.

The substrate processing apparatus according to the present invention is capable of preventing operational troubles from being caused by the liquid adhering to the substrate in the exposure device.

Other features, elements, characteristics, and advantages of the present invention will become more apparent from the following description of preferred embodiments of the present invention with reference to the attached drawings.

BRIEF DESCRIPTION OF THE DRAWINGS

FIG. 9 is a schematic diagram showing a nozzle for cleaning processing and a nozzle for drying processing formed integrally;

FIG. 10 is a schematic diagram showing another example of the nozzle for drying processing;

FIG. 12 is a schematic diagram showing another example of the nozzle for drying processing;

FIG. 14 is a diagram for illustrating the drying processing method for the case of using the cleaning/drying processing unit in FIG. 13.

DETAILED DESCRIPTION OF THE INVENTION

Substrate processing apparatuses according to the embodiment of the invention will be described with reference to the drawings.

A substrate as used in the description below includes a semiconductor substrate, a substrate for a liquid crystal display, a substrate for a plasma display, a glass substrate for a photomask, a substrate for an optical disk, a substrate for a magnetic disk, a substrate for a magneto-optical disk, and a substrate for a photomask.

Furthermore, the subsequent drawings are accompanied by the arrows that indicate X, Y, and Z directions perpendicular to one another for clarification of positions. The X and Y directions are perpendicular to each other in a horizontal plane, and the Z direction corresponds to the vertical direction. In each of the directions, the direction at which an arrow points is defined as + direction, and the opposite direction is defined as − direction. The rotation direction centered around the Z direction is defined as θ direction.

(1) Configuration of the Substrate Processing Apparatus

A substrate processing apparatus according to the embodiment of the invention will be described with reference to the drawings.

Figure 1:
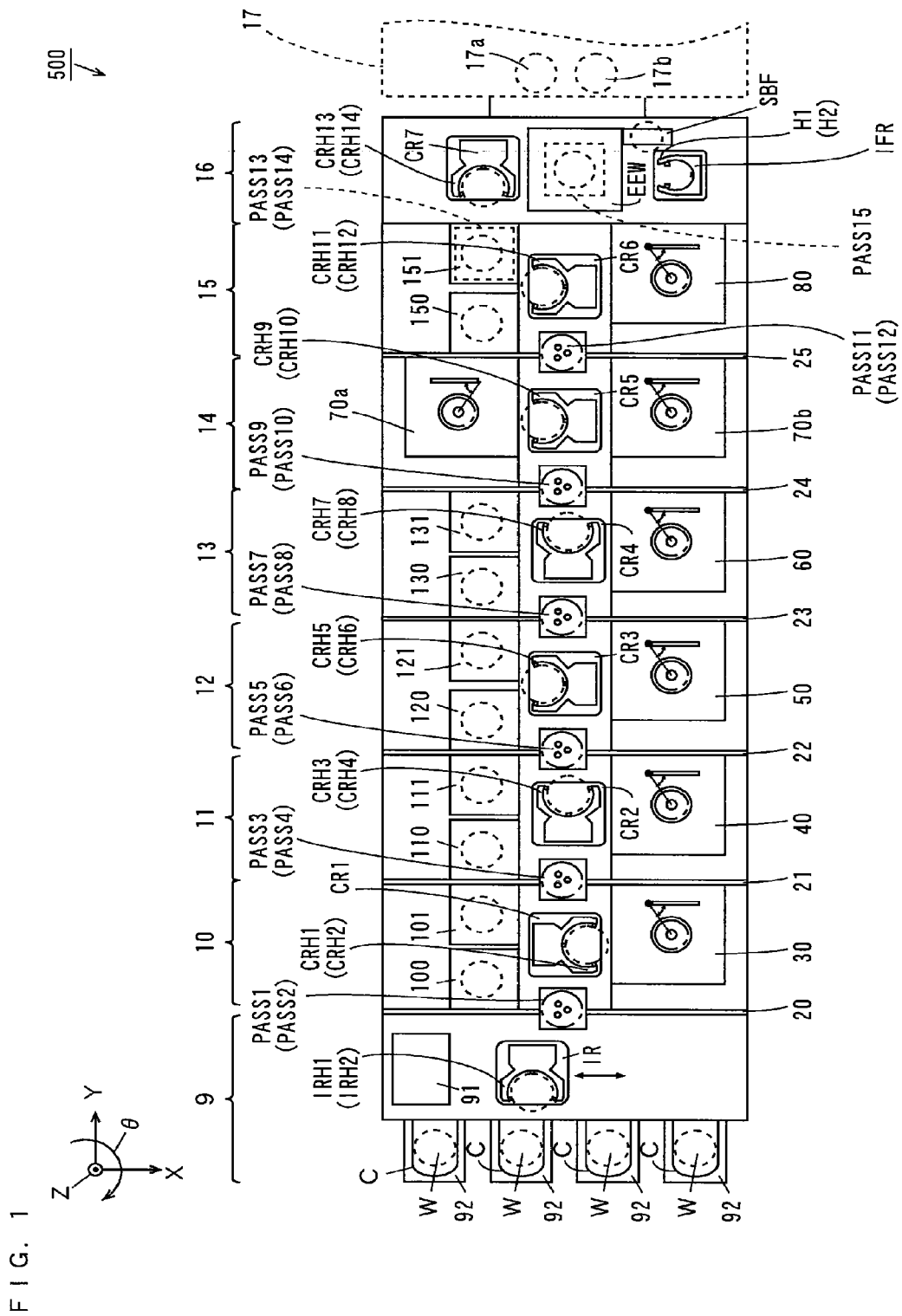
FIG. 1 is a schematic plan view of a substrate processing apparatus according to an embodiment of the invention.

FIG. 1 is a schematic plan view of a substrate processing apparatus according to the embodiment of the invention.

As shown in FIG. 1, a substrate processing apparatus 500 includes an indexer block 9, an anti-reflection film processing block 10, a resist film processing block 11, a development processing block 12, a resist cover film processing block 13, a resist cover film removal block 14, a cleaning/drying processing block 15 and an interface block 16. In the substrate processing apparatus 500, these blocks are provided in the above order.

An exposure device 17 is arranged adjacent to the interface block 16 of the substrate processing apparatus 500. The exposure device 17 applies exposure processing to substrates W by a liquid immersion method.

The indexer block 9 includes a main controller (controller) 91 for controlling the operation of each block, a plurality of carrier platforms 92, and an indexer robot IR. The indexer robot IR has hands IRH1 and IRH2 provided one above the other for receiving and transferring the substrates W.

The anti-reflection film processing block 10 includes thermal processing groups 100, 101 for anti-reflection film, a coating processing group 30 for anti-reflection film, and a first central robot CR1. The coating processing group 30 is arranged opposite to the thermal processing groups 100, 101 with the first central robot CR1 therebetween. The first central robot CR1 has hands CRH1, CRH2 provided one above the other for receiving and transferring the substrates W.

A partition wall 20 is arranged between the indexer block 9 and the anti-reflection film processing block 10 for shielding an atmosphere. The partition wall 20 has substrate platforms PASS1, PASS2 provided closely one above the other for receiving and transferring the substrates W between the indexer block 9 and the anti-reflection film processing block 10. The upper substrate platform PASS1 is used in transferring the substrates W from the indexer block 9 to the anti-reflection film processing block 10, and the lower substrate platform PASS2 is used in transferring the substrates W from the anti-reflection film processing block 10 to the indexer block 9.

Each of the substrate platforms PASS1, PASS2 has an optical sensor (not shown) for detecting the presence or absence of a substrate W. This enables a determination to be made whether or not a substrate W is on the substrate platform PASS1, PASS2.

In addition, each of the substrate platforms PASS1, PASS2 has a plurality of support pins secured thereto. Note that each of substrate platforms PASS3 to PASS16 mentioned below similarly has such an optical sensor and support pins.

The resist film processing block 11 includes thermal processing groups 110, 111 for resist film, a coating processing group 40 for resist film, and a second central robot CR2. The coating processing group 40 for resist film is arranged opposite to the thermal processing groups 110, 111 with the second central robot CR2 therebetween. The second central robot CR2 has hands CRH3, CRH4 provided one above the other for receiving and transferring the substrates W.

A partition wall 21 is arranged between the anti-reflection film processing block 10 and the resist film processing block 11 for shielding an atmosphere. The partition wall 21 has substrate platforms PASS3, PASS4 provided closely one above the other for receiving and transferring the substrates W between the anti-reflection film processing block 10 and the resist film processing block 11. The upper substrate platform PASS3 is used in transferring the substrates W from the anti-reflection film processing block 10 to the resist film processing block 11. The lower substrate platform PASS4 is used in transferring the substrates W from the resist film processing block 11 to the anti-reflection film processing block 10.

The development processing block 12 includes thermal processing groups 120, 121 for development, a development processing group 50, and a third central robot CR3. The development processing group 50 is arranged opposite to the thermal processing groups 120, 121 for development with the third central robot CR3 therebetween. The third central robot CR3 has hands CRH5, CRH6 provided one above the other for receiving and transferring the substrates W.

A partition wall 22 is arranged between the resist film processing block 11 and the development processing block 12 for shielding an atmosphere. The partition wall 22 has substrate platforms PASS5, PASS6 provided closely one above the other for receiving and transferring the substrates W between the resist film processing block 11 and the development processing block 12. The upper substrate platform PASS5 is used in transferring the substrates W from the resist film processing block 11 to the development processing block 12, and the lower substrate platform PASS6 is used in transferring the substrates W from the development processing block 12 to the resist film processing block 11.

The resist film processing block 13 includes thermal processing groups 130, 131 for resist cover film, a coating processing group 60 for resist cover film, and a fourth central robot CR4. The thermal processing groups 130, 131 for resist cover film include hydrophobic processing units HYP that apply hydrophobic processing. The hydrophobic processing unit HYP will be described in detail below.

The coating processing group 60 for resist cover film is arranged opposite to the thermal processing groups 130, 131 with the fourth central robot CR4 therebetween. The fourth central robot CR4 has hands CRH7, CRH8 provided one above the other for receiving and transferring the substrates W.

A partition wall 23 is arranged between the development processing block 12 and the resist cover film processing block 13 for shielding an atmosphere. The partition wall 23 has substrate platforms PASS7, PASS8 provided closely one above the other for receiving and transferring the substrates W between the development processing block 12 and the resist cover film processing block 13. The upper substrate platform PASS7 is used in transferring the substrates W from the development processing block 12 to the resist cover film processing block 13, and the lower substrate platform PASS8 is used in transferring the substrates W from the resist cover film processing block 13 to the development processing block 12.

The resist cover film removal block 14 includes resist cover film removal processing groups 70a, 70b, and a fifth central robot CR5. The resist cover film removal processing groups 70a, 70b are arranged opposite to each other with the fifth central robot CR5 therebetween. The fifth central robot CR5 has hands CRH9, CRH10 provided one above the other for receiving and transferring the substrates W.

A partition wall 24 is arranged between the resist cover film processing block 13 and the resist cover film removal block 14 for shielding an atmosphere. The partition wall 24 has substrate platforms PASS9, PASS10 provided closely one above the other for receiving and transferring the substrates W between the resist cover film processing block 13 and the resist cover film removal block 14. The upper substrate platform PASS9 is used in transferring the substrates W from the resist cover film processing block 13 to the resist cover film removal block 14, and the lower substrate platform PASS10 is used in transferring the substrates W from the resist cover film removal block 14 to the resist cover film processing block 13.

The cleaning/drying processing block 15 includes thermal processing groups 150, 151 for post-exposure bake, a cleaning/drying processing group 80 and a sixth central robot CR6. The thermal processing group 151 is arranged adjacent to the interface block 16 and has substrate platforms PASS13, PASS14 as described below in FIG. 3.

The cleaning/drying processing group 80 is arranged opposite to the thermal processing groups 150, 151 for post-exposure bake with the sixth central robot CR6 therebetween. The sixth central robot CR6 has hands CRH11, CRH12 provided one above the other for receiving and transferring the substrates W.

A partition wall 25 is arranged between the resist cover film removal block 14 and the cleaning/drying processing block 15 for shielding an atmosphere. The partition wall 25 has substrate platforms PASS11, PASS12 provided closely one above the other for receiving and transferring the substrates W between the resist cover film removal block 14 and the cleaning/drying processing block 15. The upper substrate platform PASS11 is used in transferring the substrates W from the resist cover film removal block 14 to the cleaning/drying processing block 15, and the lower substrate platform PASS11 is used in transferring the substrates W from the cleaning/drying processing block 15 to the resist cover film removal block 14.

The interface block 16 includes a seventh central robot CR7, a sending buffer unit SBF, an interface transport mechanism IFR, and edge exposure units EEW. A substrate platform PASS15 mentioned below, a return buffer unit RBF and two placement/cooling units PASS-CP (hereinafter, abbreviated to as P-CP) are provided under the edge exposure units EEW. Details will be described below. Note that the number of the placement/cooling unit P-CP is not limited to two and no less than three placement/cooling units P-CP may be provided if possible.

The seventh central robot CR7 has hands CRH13, CRH14 provided one above the other for receiving and transferring the substrates W, and the interface transport mechanism IFR has hands H1, H2 provided one above the other for receiving and transferring the substrates W.

Figure 2:
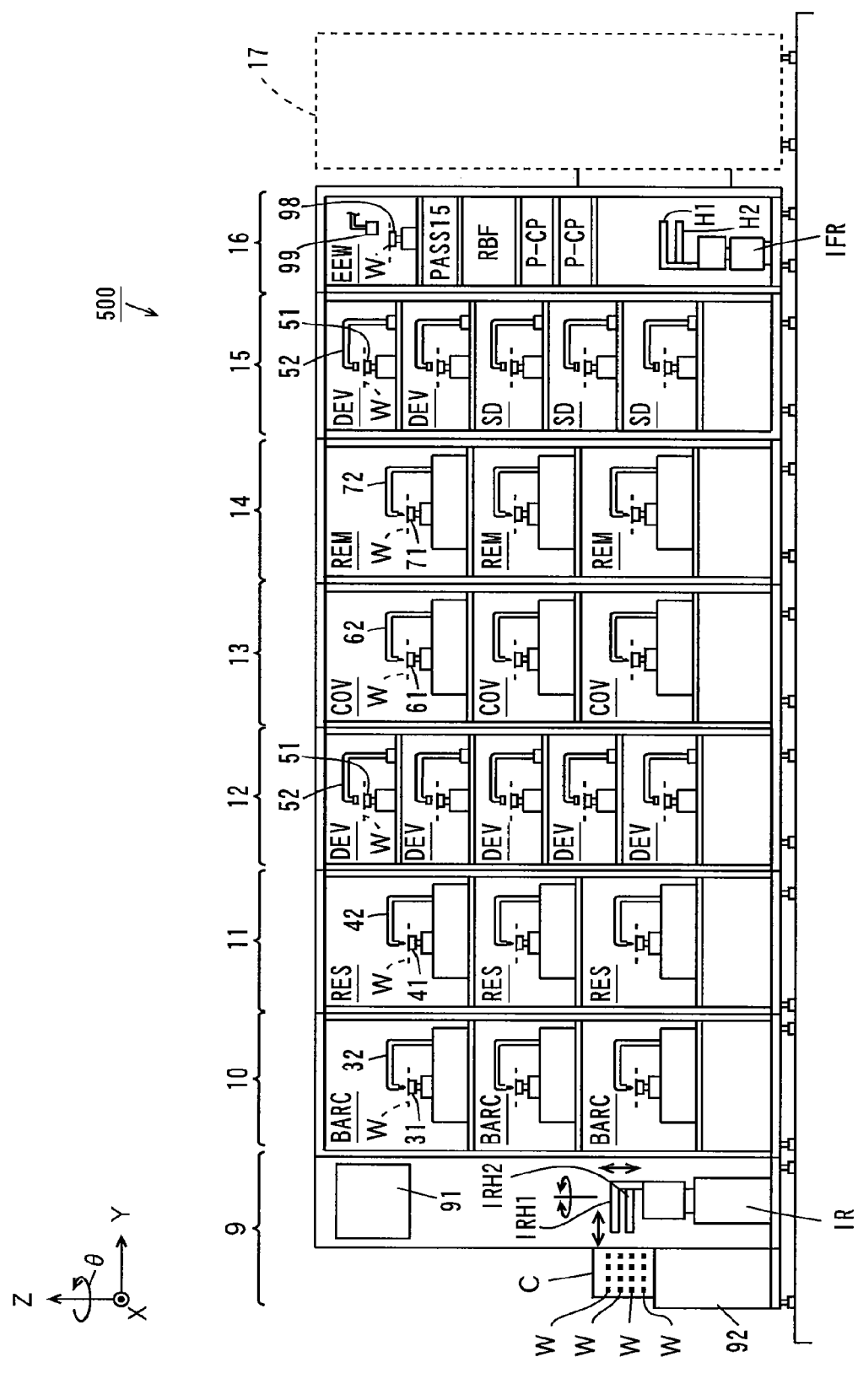
FIG. 2 is a side view of the substrate processing apparatus in FIG. 1 that is seen from the +X direction.

FIG. 2 is a side view of the substrate processing apparatus 500 in FIG. 1 that is seen from the +X direction.

The coating processing group 30 in the anti-reflection film processing block 10 (see FIG. 1) includes a vertical stack of three coating units BARC. Each of the coating units BARC includes a spin chuck 31 for rotating a substrate W while holding the substrate W in a horizontal attitude by suction, and a supply nozzle 32 for supplying coating liquid for anti-reflection film to the substrate W held on the spin chuck 31.

The coating processing group 40 in the resist film processing block 11 (see FIG. 1) includes a vertical stack of three coating units RES. Each of the coating units RES includes a spin chuck 41 for rotating a substrate W while holding the substrate W in a horizontal attitude by suction, and a supply nozzle 42 for supplying coating liquid for resist film to the substrate W held on the spin chuck 41.

The development processing group 50 in the development processing block 12 (see FIG. 1) includes a vertical stack of five development processing units DEV. Each of the development processing units DEV includes a spin chuck 51 for rotating a substrate W while holding the substrate W in a horizontal attitude by suction, and a supply nozzle 52 for supplying development liquid to the substrate W held on the spin chuck 51.

The coating processing group 60 for resist cover film in the resist cover film processing block 13 (see FIG. 1) includes a vertical stack of three coating units COV. Each of the coating units COV includes a spin chuck 61 for rotating a substrate W while holding the substrate W in a horizontal attitude by suction, and a supply nozzle 62 for supplying coating liquid for resist cover film to the substrate W held on the spin chuck 61.

It is preferable that materials having low affinity with resists and water (materials having low reactivity with resists and water) are used as the coating liquid for resist cover film. For example, fluororesin may be used as the coating liquid. Each of the coating units COV forms the resist cover film on the resist film formed on the substrate W by applying the coating liquid onto the substrate W while rotating the substrate W.

The resist cover film removal processing group 70b in the resist cover film removal block 14 (see FIG. 1) has a vertical stack of three removal units REM. Each of the removal units REM includes a spin chuck 71 for rotating a substrate W while holding the substrate W in a horizontal attitude by suction, and a supply nozzle 72 for supplying stripping liquid (e.g. fluororesin) to the substrate W held on the spin chuck 71. Each removal unit REM removes the resist cover film formed on the substrate W by applying the stripping liquid onto the substrate W while rotating the substrate W.

Note that a method of removing the resist cover films in the removal units REM is not limited to the above examples. For example, the resist cover film may be removed by supplying the stripping liquid onto the substrate W while moving a slit nozzle above the substrate W.

The cleaning/drying processing group 80 in the cleaning/drying processing block 15 (see FIG. 1) has a vertical stack of two development processing units DEV. Note that each of the development processing units DEV is the same as each of the development processing units DEV in the development processing block 12.

In addition, three cleaning/drying processing units SD are vertically stacked under the above-mentioned development processing units DEV. Details of the cleaning/drying processing units SD will be described below.

The interface block 16 includes a vertical stack of the edge exposure units EEW, the substrate platform PASS15, the return buffers RBF and the two placement/cooling units P-CP, as well as the seventh central robot CR7 (see FIG. 1) and the interface transport mechanism IFR.

Each of the edge exposure units EEW includes a spin chuck 98 for rotating a substrate W in a horizontal attitude by suction, and a light irradiator 99 for subjecting a peripheral portion of the substrate W held on the spin chuck 98 to exposure.

Figure 3:
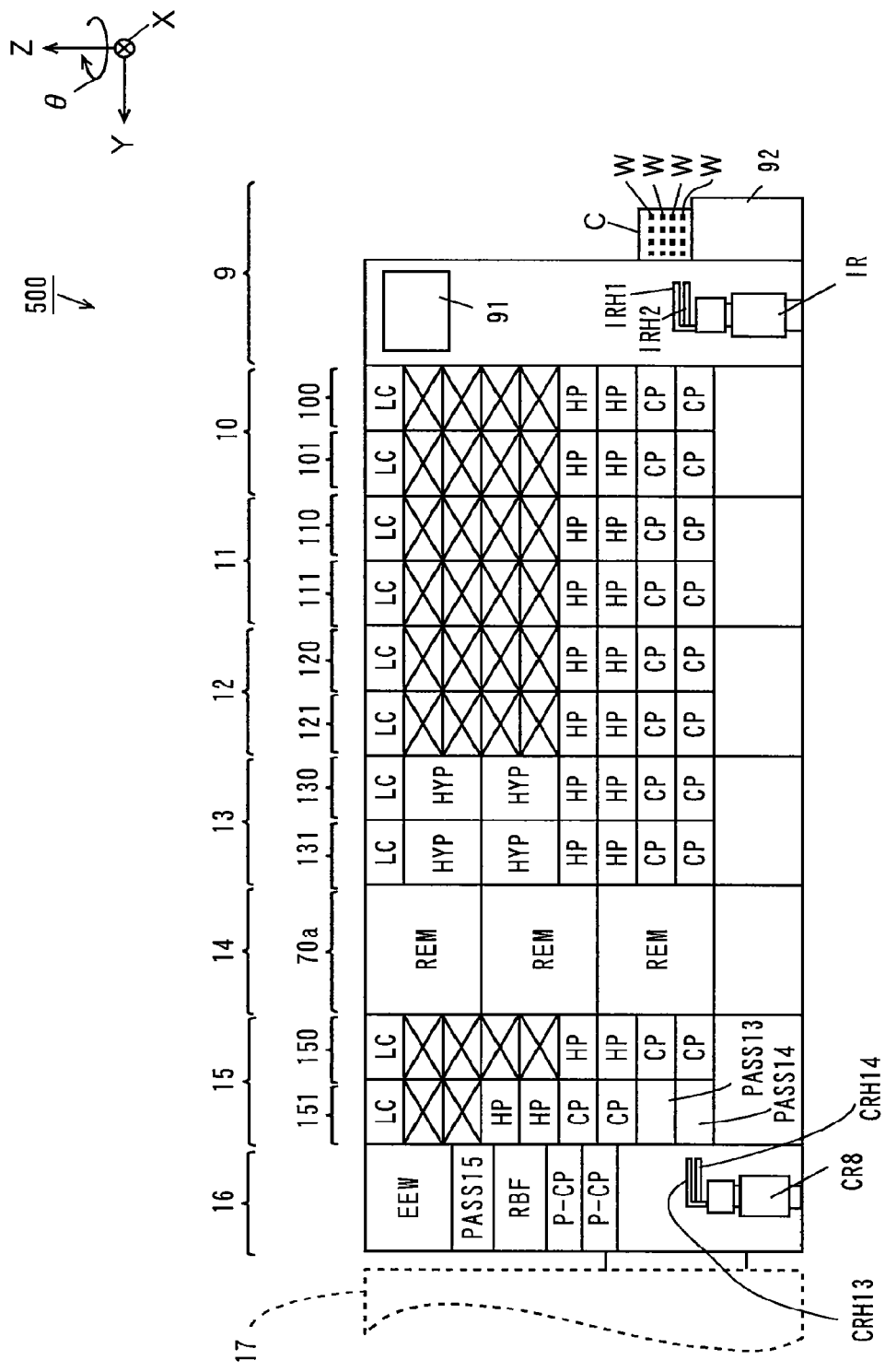
FIG. 3 is a side view of the substrate processing apparatus in FIG. 1 that is seen from the −X direction.

FIG. 3 is a side view of the substrate processing apparatus 500 in FIG. 1 that is seen from the −X direction.

In the anti-reflection film processing block 10, the thermal processing group 100 for anti-reflection film includes a vertical stack of two heating units (hot plates) HP and two cooling units CP, and the thermal processing group 101 for anti-reflection film includes a vertical stack of two heating units HP and two cooling units CP. Each of the thermal processing groups 100, 101 also includes a local controller LC on top thereof for controlling the temperatures of the cooling units CP and the heating units HP.

In the resist film processing block 11, the thermal processing group 110 for resist film includes a vertical stack of two heating units HP and two cooling units CP, and the thermal processing group 111 for resist film includes a vertical stack of two heating units HP and two cooling units CP. Each of the thermal processing groups 110, 111 also includes a local controller LC on top thereof for controlling the temperatures of the cooling units CP and the heating units HP.

In the development processing block 12, the thermal processing group 120 for development processing includes a vertical stack of two heating units HP and two cooling units CP, and the thermal processing group 121 for development processing includes a vertical stack of two heating units HP and two cooling units CP. Each of the thermal processing groups 120, 121 also includes a local controller LC on top thereof for controlling the temperatures of the cooling units CP and the heating units HP.

In the resist cover film processing block 13, the thermal processing group 130 for resist cover film includes a vertical stack of two hydrophobic processing units HYP, two heating units HP and two cooling units CP, and the thermal processing group 131 for resist cover film includes a vertical stack of two hydrophobic processing units HYP, two heating units HP and two cooling units CP. Each of the thermal processing groups 130, 131 includes a local controller LC on top thereof for controlling the temperatures of the cooling units CP and the heating units HP.

In the resist cover film removal block 14, the resist cover film removal processing group 70a includes a vertical stack of three removal units REM.

In the cleaning/drying processing block 15, the thermal processing group 150 for post-exposure bake includes a vertical stack of two heating units HP and two cooling units CP, and the thermal processing group 151 for post-exposure bake includes a vertical stack of two heating units HP, two cooling units CP, and substrate platforms PASS11, 12. Each of the thermal processing groups 150, 151 includes a local controller LC on top thereof for controlling the temperatures of the cooling units CP and the heating units HP.

Note that the number and position of the coating units BARC, RES, COV, the hydrophobic processing units HYP, the cleaning/drying processing units SD, the removal units REM, the development processing units DEV, the heating units HP and the cooling units CP can be appropriately changed depending on the processing speed of each block.

(2) Operations of the Substrate Processing Apparatus and Effects of Predetermined Transporting Processes (2-a) First Operation of the Substrate Processing Apparatus Next, the operation of the substrate processing apparatus 500 in the embodiment will be described with reference to FIGS. 1 to 3.

Carriers C for storing the substrates W in multiple stages are mounted on the carrier platforms 92, respectively, in the indexer block 9. The indexer robot IR takes out a substrate W yet to be processed that is stored in a carrier C using the upper hand IRH1. Then, the indexer robot IR moves in the ±X direction while rotating in the ±θ direction to transfer the unprocessed substrate W onto the substrate platform PASS1.

Although FOUPs (Front Opening Unified Pods) are adopted as the carriers C in this embodiment, SMIF (Standard Mechanical Inter Face) pods or OCs (Open Cassettes) that expose stored substrates W to outside air may also be used, for example.

In addition, although linear-type transport robots that move their hands forward or backward by sliding them linearly to a substrate W are used as the indexer robot IR, the first central robot CR1 to the eighth central robot CR8, and the interface transport mechanism IFR, multi joint type transport robots that linearly move their hands forward and backward by moving their joints may also be used.

The substrate W on the substrate platform PASS1 is received by the first central robot CR1 in the anti-reflection film processing block 10. The first central robot CR1 carries the substrate W into the coating processing group 30 for anti-reflection film. In the coating processing group 30, the coating unit BARC forms a coating of an anti-reflection film on the substrate W to decrease potential standing waves and halation generated during the exposure processing.

After this, the first central robot CR1 takes out the substrate W after coating processing from the coating processing group 30, and carries the substrate W into the thermal processing group 100 or 101.

Then, the first central robot CR1 takes out the thermally processed substrate W from the thermal processing group 100 or 101, and transfers the substrate W onto the substrate platform PASS3.

The substrate W on the substrate platform PASS3 is received by the second central robot CR2 in the resist film processing block 11. The second central robot CR2 transfers the substrate W onto the coating processing group 40 for resist film. In the coating processing group 40, the coating unit RES forms a coating of a resist film on the substrate W coated with the anti-reflection film.

After this, the second central robot CR2 takes out the substrate W after the coating processing from the coating processing group 40, and carries the substrate W into the thermal processing group 110 or 111. Then, the second central robot CR2 takes out the thermally processed substrate W from the thermal processing group 110 or 111, and transfers the substrate W onto the substrate platform PASS5.

The substrate W on the substrate platform PASS5 is received by the third central robot CR3 in the development processing block 12. The third central robot CR3 transfers the substrate W onto the substrate platform PASS7.

The substrate W on the substrate platform PASS7 is received by the fourth central robot CR4 in the resist cover film processing block 13. The fourth central robot CR4 carries the substrate W into the coating processing group 60. In the coating processing group 60, the coating unit COV forms a coating of a resist cover film over the resist film as described above.

The fourth central robot CR4 then takes out the substrate W after coating processing from the coating processing group 60, and transfers the substrate W into the thermal processing group 130 or 131 for resist cover film.

In the thermal processing group 130 or 131, after the thermal processing is applied to the substrate W by the heating unit HP and the cooling unit CP, the hydrophobic processing is applied to the surface of the resist cover film by the hydrophobic processing units HYP.

The fourth central robot CR4 then takes out the substrate W after the thermal processing and the hydrophobic processing from the thermal processing group 130 or 131, and carries the substrate W onto the substrate platform PASS9.

The substrate W on the substrate platform PASS9 is received by the fifth central robot CR5 in the resist cover film removal block 14. The fifth central robot CR5 transfers the substrate W onto the substrate platform PASS11.

The substrate W on the substrate platform PASS11 is received by the sixth central robot CR6 in the cleaning/drying processing block 15. The sixth central robot CR6 transfers the substrate W onto the substrate platform PASS13.

The substrate W on the substrate platform PASS13 is received by the seventh central robot CR7 in the interface block 16.

The seventh central robot CR7 carries the substrate W into the edge exposure unit EEW. In the edge exposure unit EEW, the peripheral portion of the substrate W is subjected to the exposure processing.

Here, the time of the exposure processing by the exposure device 17 is ordinarily longer than that of other processing and transporting processes. As a result, the exposure device 17 cannot accept the subsequent substrate W in many cases. In this case, the substrate W is temporarily stored in the sending buffer unit SBF. In this embodiment, the seventh central robot CR7 takes out the substrate W after edge exposure processing from the edge exposure unit EEW and transports the substrate W to the sending buffer unit SBF.

Next, the seventh central robot CR7 transports the substrate W stored in the sending buffer unit SBF to one of the two placement/cooling units P-CP which is available. The substrate W transported to the placement/cooling unit P-CP is kept at the same temperature as that in the exposure device 17 (for example, 23° C.).

The substrate W kept at the above-mentioned predetermined temperature in the placement/cooling unit P-CP is subsequently received by the interface transport mechanism IFR and carried into a substrate inlet 17a (see FIG. 1) in the exposure device 17.

The substrate W after the exposure processing in the exposure device 17 is taken out by the interface transport mechanism IFR from a substrate outlet 17b of the exposure device 17 (see FIG. 1) and carried into the cleaning/drying processing group 80 in the cleaning/drying processing block 15. In the cleaning/drying processing unit SD in the cleaning/drying processing group 80, the substrate W after the exposure processing is subjected to cleaning and drying processing. Details of the cleaning and drying processing will be described below.

(2-b) Predetermined Transporting Processes and Effects Thereof

Here, the transporting processes from the end of the cleaning and drying processing of the substrate W in the cleaning/drying processing unit SD in the cleaning/drying processing group 80 to the limitation of post-exposure bake (PEB) as described below in the thermal processing group 151 for post-exposure in the cleaning/drying processing block will be explained. In this embodiment, two kinds of transporting processes (hereinafter, referred to as a first transporting process and a second transporting process) are provided.

First, the first transporting process is described below. In the cleaning/drying processing group 80, after the cleaning and drying processing is applied to the substrate W after the exposure processing, the sixth central robot CR6 takes out the substrate W from the cleaning/drying processing group 80 and carries that substrate W into the thermal processing group 151 for post-exposure in the cleaning/drying processing block 15.

Next, the second transporting process is described below. After the substrate W after the exposure processing is subjected to cleaning and drying processing in the cleaning/ drying processing group 80, the interface transport mechanism IFR takes out the substrate W from the cleaning/drying processing group 80 and carries the substrate W onto the substrate platform PASS15. Details of the operations of the interface transport mechanism IFR in the interface block 16 will be described below.

When cleaning and drying processing can not be applied temporarily in the cleaning/drying processing group 80 due to failure or the like, the substrate W after the exposure processing can be stored temporarily in the return sending buffer unit SBF in the interface block 16.

The substrate W on the substrate platform PASS15 is received by the seventh central robot CR7 in the interface block 16. The seventh central robot CR7 carries the substrate W into the thermal processing group 151 for post-exposure bake in the cleaning/drying processing block 15.

In this way, in the first transporting process, the time of post exposure delay (PED: Post Exposure Delay) including the time of the cleaning and drying processing in the cleaning/drying processing group 80 can be minimized. Thus, the post-exposure bake can be applied to the substrate W after the exposure processing at an early stage. This can prevent oxidation of the substrate W after the exposure processing. Note that the above-mentioned time of post exposure delay indicates the time from the end of the exposure processing to the limitation of the post-exposure bake.

Furthermore, in the second transporting process, when the substrate W before the exposure processing is transported to the substrate inlet 17a of the exposure device 17 and when the substrate W after the cleaning and drying processing is transported from the cleaning/drying processing unit SD to the substrate platform PASS15, the hand Hi of the interface transport mechanism IFR is used, and when the substrate W after the exposure processing is transported from the substrate outlet 17b of the exposure device 17 to the cleaning/drying processing unit SD, the hand H2 of the exposure device 17 is used.

That is to say, the hand Hi is used for transporting the substrate W with no liquid adhering and the hand H2 is used for transporting the substrate W with a liquid adhering.

In this case, since the liquid adhering to the substrate W during the exposure processing is prevented from adhering to the hand H1, the liquid is prevented from adhering to the substrate W before the exposure processing. In addition, since the hand H2 is provided below the hand H1, even if the liquid drops from the hand H2 and the substrate W held thereby, the liquid can be prevented from adhering to the hand H1 and the substrate W held thereby. This can reliably prevent the liquid from adhering to the substrate W before the exposure processing. As a result, contamination of the substrate W before the exposure processing can be reliably prevented.

In this way, in the second transporting process, when the substrate W after the cleaning and drying processing is transported from the cleaning/drying processing unit SD to the substrate platform PASS15, it is necessary to selectively use the hand H1 out of the hands H1, H2 of the interface transport mechanism IFR.

In contrast, in the first transporting process, since the substrate W after the cleaning and drying processing is carried into the thermal processing group 151 for post-exposure bake by the sixth central robot CR6, the above mentioned selective use of the hands is not necessary.

(2-c) Second Operation of the Substrate Processing Apparatus

Next, what follows the above-described first operation of the substrate processing apparatus is described below. In the thermal processing group 151 for post-exposure bake, post-exposure bake is applied to the substrate W. Then, the seventh central robot CR7 takes out the substrate W from the thermal processing group 151 for post-exposure bake and carries the substrate W onto the substrate platform PASS14.

Although post-exposure bake is applied by the thermal processing group 151 for post-exposure bake in this embodiment, it is also possible to apply post-exposure bake by the thermal processing group 150 for post-exposure bake.

The substrate W on the substrate platform PASS14 is received by the sixth central robot CR6 in the cleaning/drying processing block 15. The sixth central robot CR6 carries the substrate W onto the substrate platform PASS12.

The substrate W on the substrate platform PASS12 is received by the fifth central robot CR5 in the resist cover film removal block 14. The fifth central robot CR5 carries the substrate W into the resist cover film removal processing group 70a or the resist cover film removal processing group 70b. The resist cover film on the substrate W is removed by a removal unit REM in the resist cover removal processing unit 70a or 70b.

After that, the fifth central robot CR5 takes out the processed substrate W from the resist cover film removal processing group 70a or the resist cover film removal processing group 70b and carries the substrate W on to the substrate platform PASS10.

The substrate W on the substrate platform PASS10 is received by the fourth central robot CR4 in the resist cover film processing block 13. The fourth central robot CR4 carries the substrate W onto the substrate platform PASS8.

The substrate W on the substrate platform PASS8 is received by the third central robot CR3 in the development processing block 12. The third central robot CR3 carries the substrate W into the development processing group 50. In the development processing group 50, development processing is applied to the substrate W by a development processing unit DEV. This development processing may be applied by a development processing unit DEV in the cleaning/drying processing block 15.

The third central robot CR3 then takes out the substrate W after development processing from the development processing group 50 and carries the substrate W into the thermal processing group 120 or 121 for development.

The third central robot CR3 subsequently takes out the substrate W after thermal processing from the thermal processing group 120 or 121 for development and carries the substrate W into the substrate platform PASS6.

The substrate W on the substrate platform PASS6 is received by the second central robot CR2 in the resist film processing group 11. The second central robot CR2 carries the substrate W onto the substrate platform PASS4.

The substrate W on the substrate platform PASS4 is received by the first central robot CR1 in the anti-reflection film processing block 10. The first central robot CR1 carries the substrate W onto the substrate platform PASS2.

The substrate W on the substrate platform PASS2 is stored in a carrier C by the indexer robot IR in the indexer block 9.

(3) Hydrophobic Processing Unit HYP

Now, the aforementioned hydrophobic processing unit HYP will be described in detail with reference to drawings.

Figure 4:
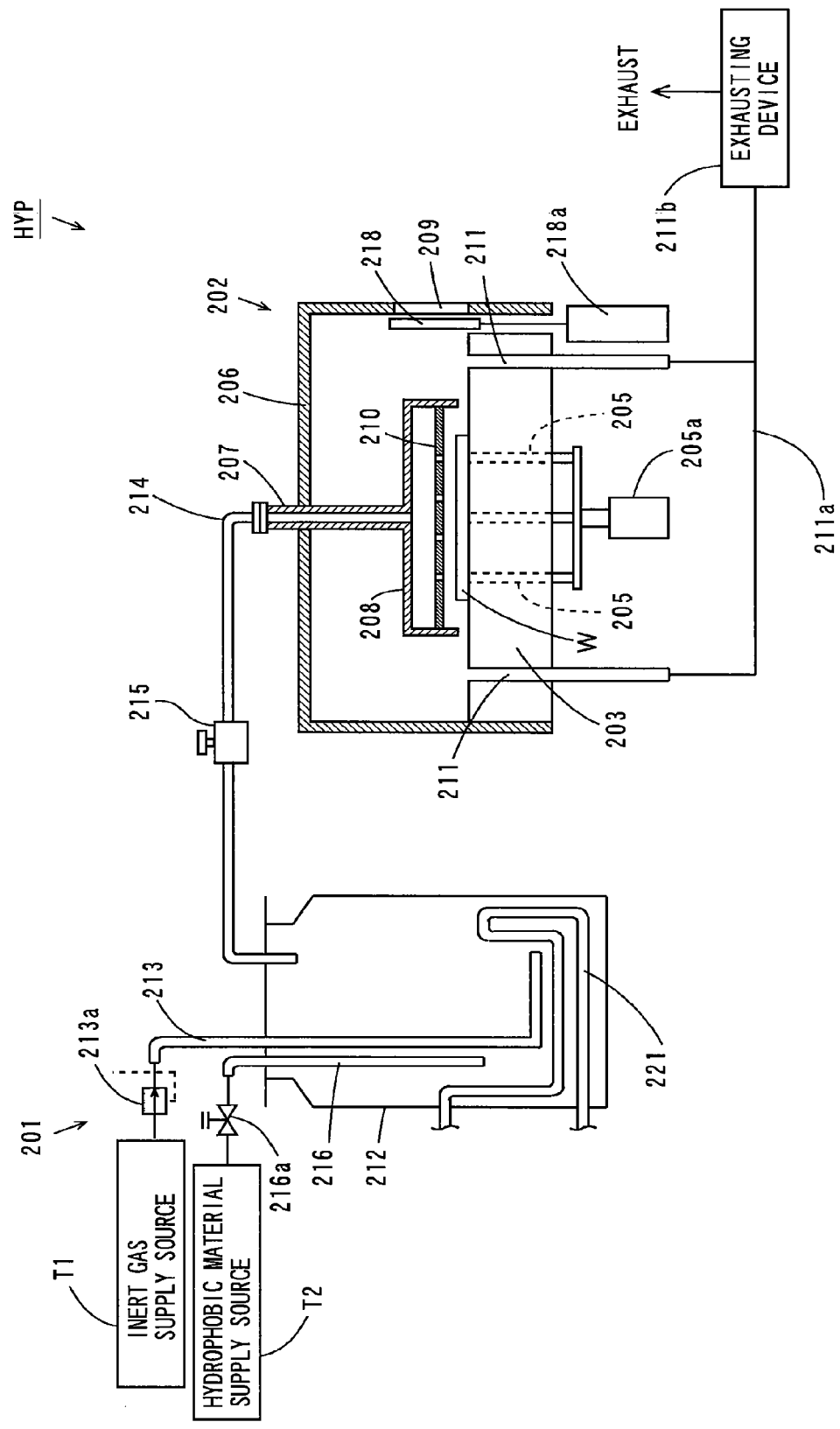
FIG. 4 is a cross-sectional view for use in illustrating the configuration of a hydrophobic processing unit.

FIG. 4 is a cross-sectional diagram for use in illustrating a configuration of the hydrophobic processing unit HYP.

As shown in FIG. 4, the hydrophobic processing unit HYP includes a vaporization processing device 201 for vaporizing a liquid hydrophobic material, and a hydrophobic material supply device 202 for supplying a hydrophobic material vaporized in the vaporization processing device 201 to the substrate W.

The vaporization processing device 201 includes a liquid storage tank 212 for storing the hydrophobic material. The liquid storage tank 212 is connected to an inert gas supply source T1 through an inert gas pipe 213, and to a hydrophobic material supply source T2 through a hydrophobic material supply pipe 216.

The inert gas supply pipe 213 is provided with a regulator 213a, and then an inert gas is supplied from the inert gas supply source T1 to the liquid storage tank 212 under a certain pressure. The hydrophobic material supply pipe 216 is provided with a valve 216a and a hydrophobic material is supplied from the hydrophobic material supply source T2 to the liquid storage tank 212 by opening the valve 216a.

A heat exchange coil 221 is provided at the lower portion in the liquid storage tank 212. With electric current supplied to the heat exchange coil 221, the temperature of the heat exchange coil 221 rises and the hydrophobic material in the liquid storage tank 212 is vaporized.

The hydrophobic material supply device 202 has a substrate platform plate 203. The substrate platform plate 203 heats the substrate W mounted on its top surface to a predetermined temperature.

A plurality of lifting pins 205 are provided to go through the substrate platform plate 203 in the vertical direction. The lifting pins 205 are moved up and down by a lifting pins driving device 205a.

In addition, an exhaust port 211 is provided so as to surround the periphery of the substrate platform plate 203. The exhaust port 211 is connected to an exhausting device 211b through a pipe 211a. An atmosphere over the substrate platform plate 203 is exhausted by the exhausting device 211b from the exhaust port 211 through the pipe 211a.

A cover 206 is provided over the substrate platform plate 203. A tubular supporting member 207 is provided so as to move up and down through the center of the cover 206 in the vertical direction. A pipe 214 is connected to the upper end of the supporting member 207 so as to be communicated with the liquid storage tank 212 in the vaporization processing device 201.

The hydrophobic material vaporized in the vaporization processing device 201 is fed through the pipe 214 in the supporting member 207 in the hydrophobic material supply device 202. The pipe 214 is provided with a valve 215, and the flow rate of the hydrophobic material fed from the vaporization processing device 201 to the hydrophobic material supply device 202 is controlled by opening and closing the valve 215.

A chamber 208 is provided at the lower end of the supporting member 207. The inside of the supporting member 207 is communicated with the inner space of the chamber 208. A current plate 210 having a plurality of holes in its whole plane is provided inside the chamber 208. The chamber 208 is arranged above so as to move up and down the substrate platform plate 203 with the current plate 210 opposite to the substrate W.

A side of the cover 206 has the carry-in/out opening 209 through which is carried in and out the substrate W. A shutter 218 is provided to close the carry-in/out opening 209 inside the cover 206. This shutter 218 moves up and down by a shutter driving device 218a to open and close the carry-in/out opening 209.

Next, the operation of the hydrophobic processing unit HYP with the aforementioned configuration is described. Note that the operation of each constituent element in the hydrophobic processing unit HYP described below is controlled by a main controller 91 in FIG. 1.

First, the supporting member 207 and the chamber 208 are moved up, and the lifting pins 205 are moved up by the lifting pins driving device 205a. The shutter 218 is moved down by the shutter driving device 218a so that the carry-in/out opening 209 is opened.

In this state, the substrate W is mounted onto the lifting pins 205 inside the cover 206 by the fourth central robot CR4 in FIG. 4. Then, the lifting pins 205 are moved down by the lifting pins driving device 205a, so that the substrate W on the lifting pins 205 is supported on the top surface of the substrate platform plate 203. In addition, the shutter 218 is moved up by the shutter driving device 218a, so that the carry-in/out opening 209 is closed.

The supporting member 207 and the chamber 208 are subsequently moved down. In this state, the substrate W on the substrate platform plate 203 is heated up to a predetermined temperature. Preferably, the temperature of the substrate W is controlled by the substrate platform plate 203 within the range of 23 to 150° C.

Next, the vaporized hydrophobic material is fed from the liquid storage tank 212 through the pipe 214 into the supporting member 207 in the hydrophobic material supply device 202 and supplied to the substrate W through a plurality of fine holes of the current plate 210. Thus, the hydrophobic processing is applied to the surface of the resist cover film on the substrate W. The hydrophobic material inside the cover 206 is exhausted by the exhausting device 211b from the exhaust port 211 through the pipe 211a.

After the processing is finished, the supporting member 207 and the chamber 208 are moved up. Then, the lifting pins 205 are moved up by the lifting pins driving device 205a, so that the substrate W is lifted up by the lifting pins 205.

Furthermore, the shutter 218 is moved down by the shutter driving device 218a and the carry-in/out opening 209 of the cover 206 is opened. Then, the fourth central robot CR4 in FIG. 1 carries the substrate W out of the hydrophobic processing unit HYP.

As the hydrophobic material supplied to the substrate W, materials which do not degrade the characteristics of the resist film and the resist cover film and prevent liquid from soaking into the resist film and the resist cover film are used. For example, HMDS (hexamethyldisilazane) or low-molecular materials or the like can be used. Nitrogen ($N_2$) gas, for example, can be used as an inert gas to be supplied by the vaporization processing device 201. Other gases such as argon (Ar) gas can be also used as an inert gas.

(4) Cleaning/Drying Processing Unit

Now, the aforementioned cleaning/drying processing unit SD will be described in detail with reference to drawings.

(4-a) Configuration of Cleaning/Drying Processing Unit

Figure 5:
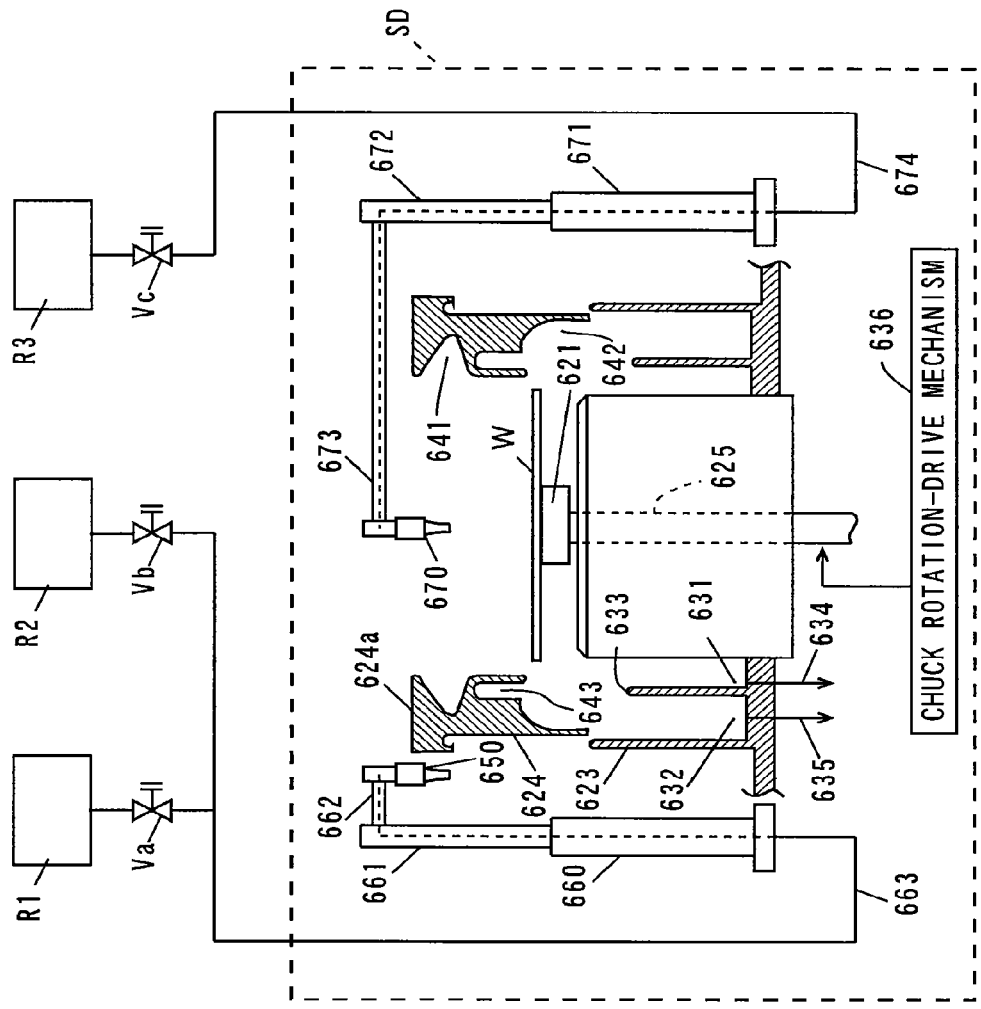
FIG. 5 is a diagram for use in illustrating the configuration of the cleaning/drying processing unit.

The configuration of a cleaning/drying processing unit SD is described. FIG. 5 is a diagram for use in illustrating the configuration of the cleaning/drying processing unit SD.

As shown in FIG. 5, the cleaning/drying unit SD includes a spin chuck 621 for rotating a substrate W about the vertical rotation shaft passing through the center of the substrate W while horizontally holding the substrate W.

The spin chuck 621 is secured to an upper end of a rotation shaft 625, which is rotated via a chuck rotation-drive mechanism 636. An air suction passage (not shown) is formed in the spin chuck 621. With the substrate W being mounted on the spin chuck 621, air inside the air suction passage is discharged, so that a back surface of the substrate W is sucked onto the spin chuck 621 by vacuum, and the substrate W can be held in a horizontal attitude.

A first rotation motor 660 is arranged outside the spin chuck 621. The first rotation motor 660 is connected to a first rotation shaft 661. The first rotation shaft 661 is coupled to a first arm 662, which extends in the horizontal direction, and whose end is provided with a nozzle 650 for cleaning processing.

The first rotation shaft 661 is rotated by the first rotation motor 660, so that the first arm 662 swings. This causes the nozzle 650 to move above the substrate W held on the spin chuck 621.

A supply pipe 663 for cleaning processing is arranged so as to pass through the inside of the first rotation motor 660, the first rotation shaft 661, and the first arm 662. The supply pipe 663 is connected to a cleaning liquid supply source R1 and a rinse liquid supply source R2 through a valve Va and a valve Vb, respectively.

By controlling the opening and closing of the valves Va, Vb, it is possible to select a processing liquid supplied to the supply pipe 663 and adjust the amount of the processing liquid. In the configuration of FIG. 5, when the valve Va is opened, a cleaning liquid is supplied to the supply pipe 663, and when the valve Vb is opened, a rinse liquid is supplied to the supply pipe 663.

The cleaning liquid or the rinse liquid is supplied to the nozzle 650 through the supply pipe 663 from the cleaning liquid supply source R1 or the rinse liquid supply source R2. The cleaning liquid or the rinse liquid is thus supplied to a main surface of the substrate W. Examples of the cleaning liquid may include pure water, a pure water solution containing a complex (ionized), or a fluorine-based chemical solution such as HFE (hydrofluoroether). Examples of the rinse liquid may include pure water, carbonated water, hydrogen water and electrolytic ionic water.

A second rotation motor 671 is arranged outside the spin chuck 621. The second rotation motor 671 is connected to a second rotation shaft 672. The second rotation shaft 672 is coupled to a second arm 673, that extends in the horizontal direction, and whose end is provided with a nozzle 670 for drying processing.

The second rotation shaft 672 is rotated by the second rotation motor 671, so that the second arm 673 swings. This causes the nozzle 670 to move above the substrate W held on the spin chuck 621.

A supply pipe 674 for drying processing is arranged so as to pass through the inside of the second rotation motor 671, the second rotation shaft 672, and the second arm 673. The supply pipe 674 is connected to an inert gas supply source R3 through a valve Vc. By controlling the opening and closing of the valve Vc, it is possible to adjust the amount of the inert gas supplied to the supply pipe 674.

The inert gas is supplied to the nozzle 670 through the supply pipe 674 from the inert gas supply source R3. The inert gas is thus supplied to the main surface of the substrate W. Nitrogen gas, for example, may be used as the inert gas.

When supplying the cleaning liquid or the rinse liquid onto the main surface of the substrate W, the nozzle 650 is positioned above the substrate. When supplying the inert gas onto the main surface of the substrate W, the nozzle 650 is retracted to a predetermined position.

When supplying the cleaning liquid or the rinse liquid onto the main surface of the substrate W, the nozzle 670 is retracted to a predetermined position. When supplying the inert gas onto the main surface of the substrate W, the nozzle 670 is positioned above the substrate W.

The substrate W held on the spin chuck 621 is housed in a processing cup 623. A cylindrical partition wall 633 is provided inside the processing cup 623. A discharge space 631 is formed so as to surround the spin chuck 621 for discharging the processing liquid (i.e., cleaning liquid or rinse liquid) used in processing the substrate W. Also, a liquid recovery space 632 is formed between the processing cup 623 and the partition wall 633, so as to surround the discharge space 631, for recovering the processing liquid used in processing the substrate W.

The discharge space 631 is connected with a discharge pipe 634 for directing the processing liquid to a liquid discharge processing device (not shown), while the liquid recovery space 632 is connected with a recovery pipe 635 for directing the processing liquid to a recovery processing device (not shown).

A guard 624 is provided above the processing cup 623 for preventing the processing liquid on the substrate W from splashing outward. The guard 624 is configured to be rotation-symmetric with respect to the rotation shaft 625. An annular-shaped liquid discharge guide groove 641 with a V-shaped cross section is formed inwardly of an upper end portion of the guard 624.

Furthermore, a liquid recovery guide 642 having an inclined main surface that inclines down outwardly is formed inwardly of a lower portion of the guard 624. A partition wall housing groove 643 for receiving the partition wall 633 in the processing cup 623 is formed in the vicinity of the upper end of the liquid recovery guide 642.

This guard 624 is provided with a guard lifting mechanism (not shown) composed of a ball-screw mechanism or the like. The guard lifting mechanism lifts and lowers the guard 624 between a recovery position in which the liquid recovery guide 642 is positioned opposite to outer edges of the substrate W held on the spin chuck 621 and a discharge position in which the liquid discharge guide groove 641 is positioned opposite to the outer edges of the substrate W held on the spin chuck 621. When the guard 624 is in the recovery position (i.e., the position of the guard shown in FIG. 5), the processing liquid splashed out from the substrate W is directed by the liquid recovery guide 642 to the liquid recovery space 632, and then recovered through the recovery pipe 635. On the other hand, when the guard 624 is in the discharge position, the processing liquid splashed out from the substrate W is directed by the liquid discharge guide groove 641 to the discharge space 631, and then discharged through the discharge pipe 634. With such a configuration, discharge and recovery of the processing liquid is performed.

(4-b) Operation of the Cleaning/Drying Processing Unit

The processing operation of the cleaning/drying processing unit SD having the aforementioned configuration is next described. Note that the operation of each component in the cleaning/drying processing unit SD described below is controlled by the main controller (controller) 91 in FIG. 1.

When the substrate W is initially carried into the cleaning/drying processing unit SD, the guard 624 is lowered, and the interface transport mechanism IFR in FIG. 1 places the substrate W onto the spin chuck 621. The substrate W on the spin chuck 621 is held by suction.

Next, the guard 624 moves to the aforementioned discharge position, and the nozzle 650 moves above the center of the substrate W. Then, the rotation shaft 625 rotates, causing the substrate W held on the spin chuck 621 to rotate. After this, the cleaning liquid is discharged onto the main surface of the substrate W from the nozzle 650. The substrate W is thus cleaned.

In the cleaning/drying processing unit 80a, the part of the component of the resist cover film on the substrate W is eluted in the cleaning liquid. During the cleaning of the substrate W, the substrate W is rotated since the cleaning liquid is supplied onto the substrate W. This causes the cleaning liquid on the substrate W to constantly move toward a peripheral portion of the substrate W by the centrifugal force, and splash away. It is therefore possible to prevent the component of the resist cover film eluted in the cleaning liquid from remaining on the substrate W. Note that the aforementioned resist cover film component may be eluted with pure water being poured onto the substrate W and kept thereon for a certain period. The supply of the cleaning liquid onto the substrate W may also be executed by a soft spray method using a two-fluid nozzle.

After the elapse of a predetermined time, the supply of the cleaning liquid is stopped, and the rinse liquid is discharged from the nozzle 650. The cleaning liquid on the substrate W is thus cleaned away.

After the elapse of another predetermined time, the rotation speed of the rotation shaft 625 decreases. This reduces the amount of the rinse liquid that is shaken off by the rotation of the substrate W, resulting in the formation of a liquid layer L of the rinse liquid over the entire main surface of the substrate W, as shown in FIG. 6(a). Alternatively, the rotation of the rotation shaft 625 may be stopped to form the liquid layer L over the entire main surface of the substrate W.

The supply of the rinse liquid is subsequently stopped, and the nozzle 650 retracts to the predetermined position while the nozzle 670 moves above the center of the substrate W. The inert gas is subsequently discharged from the nozzle 670. This causes the rinse liquid around the center of the substrate W to move toward the peripheral portion of the substrate W, leaving the liquid layer L only on the peripheral portion, as shown in FIG. 6(b).

Next, as the number of revolutions of the rotation shaft 625 (see FIG. 5) increases, the nozzle 670 gradually moves from above the center of the substrate W to above the peripheral portion thereof, as shown in FIG. 6(c). This causes a great centrifugal force acting on the liquid layer L on the substrate W while allowing the inert gas to be sprayed toward the entire main surface of the substrate W, thereby ensuring the removal of the liquid layer L on the substrate W. As a result, the substrate W can be reliably dried.

Then, the supply of the inert gas is stopped, and the nozzle 670 retracts to the predetermined position while the rotation of the rotation shaft 625 is stopped. After this, the guard 624 is lowered, and the interface transport mechanism IFR in FIG. 1 carries the substrate W out of the cleaning/drying processing unit SD. The processing operation of the cleaning/drying processing unit SD is thus completed. It is preferred that the position of the guard 624 during cleaning and drying processing is suitably changed according to the necessity of the recovery or discharge of the processing liquid.

According to the above embodiment, although the configuration of sharing the nozzle 650 for the supply of both the cleaning liquid and the rinse liquid is adopted to allow either of the cleaning liquid and the rinse liquid to be supplied from the nozzle 650, the configuration of using the nozzle separately for the cleaning liquid and the rinse liquid may be also adopted.

In the case of supplying the rinse liquid, pure water may be also supplied from a nozzle for a back rinse that is not illustrated to the back of the substrate W so as to prevent the rinse liquid from flowing around to the back of the substrate W.

In the case of using pure water that cleans the substrate W, it is not necessary to supply the rinse liquid.

Although in the above-described embodiment, the substrate W is subjected to the drying processing by a spin drying method, the substrate W may be also subjected to the drying processing by other methods such as a reduced pressure drying method and an air knife drying method.

Although in the above-described embodiment, the inert gas is supplied from the nozzle 670 with the liquid layer L of the rinse liquid formed, the inert gas may be supplied from the nozzle 670 and the substrate W may be thoroughly dried immediately after the liquid layer of the cleaning liquid is shaken off once by rotating the substrate W when the liquid layer L of the rinse liquid is not formed or the rinse liquid is not used.

(5) Interface Transport Mechanism of the Interface Block

Figure 7:
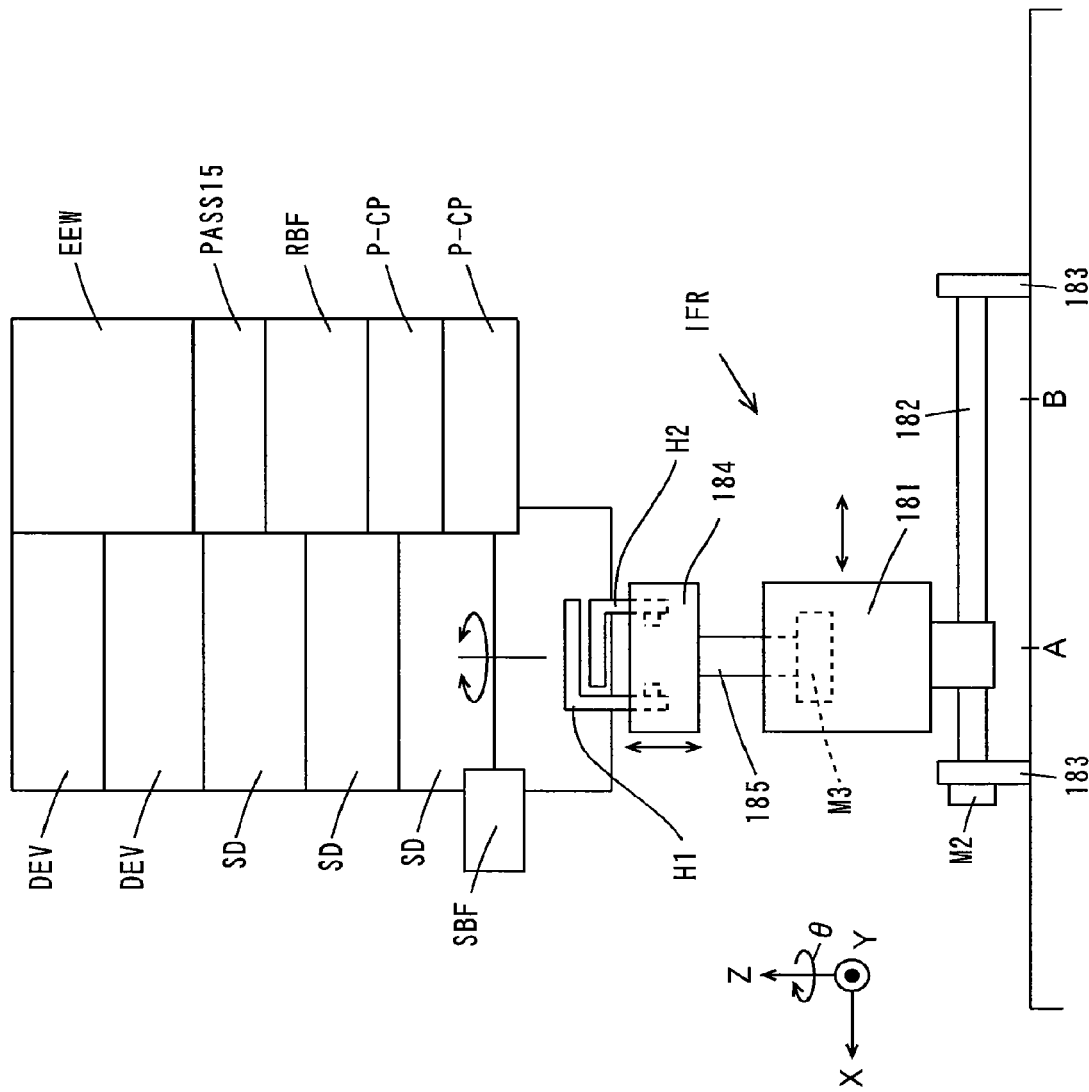
FIG. 7 is a diagram for use in illustrating the configuration and the operation of the interface transport mechanism.

The interface transport mechanism IFR is described. FIG. 7 is a diagram for illustrating the configuration and the operation of the interface transport mechanism IFR. The configuration of the interface transport mechanism IFR is first described.

As shown in FIG. 7, a movable base 181 in the interface transport mechanism IFR is threadably mounted to a screwed shaft 182. The screwed shaft 182 is rotatably supported with support bases 183 so as to extend in the X direction. One end of the screwed shaft 182 is provided with a motor M2, which causes the screwed shaft 182 to rotate and the movable base 181 to move horizontally in the ±X direction.

Furthermore, a hand support base 184 is mounted on the movable base 181 so as to rotate in the ±θ. direction and move up and down in the ±Z direction. The hand support base 184 is coupled to a motor M3 in the movable base 181 through a rotation shaft 185 and rotated by the motor M3. Two hands H1, H2 for holding the substrate W in a horizontal attitude are provided to the hand support base 184 one above the other so as to move forward and backward.

The operation of the interface transport mechanism IFR is next described. The operation of the interface transport mechanism IFR is controlled by the main controller 91 in FIG. 1.

The interface transport mechanism IFR initially rotates the hand support base 184 at a position A in FIG. 7 while lifting the hand support base 184 in the ±Z direction, to allow the upper hand H1 to enter the placement/cooling unit P-CP.

When the hand H1 has received the substrate W in the placement/cooling unit P-CP, the interface transport mechanism IFR retracts the hand H1 from the placement/cooling unit P-CP and lowers the hand support base 184 in the −Z direction.

The interface transport mechanism IFR then moves in the −X direction, and rotates the hand support base 184 at a position B while allowing the hand H1 to enter the substrate inlet 17a in the exposure device 17 (see FIG. 1). After carrying the substrate W into the substrate inlet 17a, the interface transport mechanism IFR retracts the hand H1 from the substrate inlet 17a.

The interface transport mechanism IFR subsequently allows the lower hand H2 to enter the substrate outlet 17b (see FIG. 1). When the hand H2 has received the substrate W after the exposure processing from the substrate outlet 17b, the interface transport mechanism IFR retracts the hand H2 from the substrate outlet 17b.

After that, the interface transport mechanism IFR moves in the +X direction, and rotates the hand support base 184 at the position A, while allowing the hand H2 to enter the cleaning/drying processing unit SD, and transfers the substrate W to the cleaning/drying unit SD. This causes the cleaning/drying processing unit SD to apply cleaning and drying processing to the substrate W after the exposure processing.

Then, the interface transport mechanism IFR allows the upper hand H2 to enter the cleaning/drying unit SD, and receives the substrate W after cleaning and drying processing from the cleaning/drying processing unit SD. The substrate W is mounted onto the upper substrate platform PASS15 by the interface transport mechanism IFR.

As mentioned above, if the exposure device 17 is not capable of receiving the substrate W, the substrate W is temporarily stored at the sending buffer unit SBF. In addition, if the cleaning/drying unit SD is not capable of performing cleaning and drying processing temporarily, the substrate W after the exposure processing is temporarily stored in the return buffer unit RBF in the interface block 16.

Although the single interface transport mechanism IFR transports the substrate W from the placement/cooling unit P-CP to the exposure device 17 and from the exposure device 17 to the cleaning/drying processing unit SD in this embodiment, a plurality of interface transport mechanisms IFR may be used for transporting the substrate W.

(6) Effects According to the Embodiment (6-a) Effects of Cleaning Processing of the Substrate After the Exposure Processing In this embodiment, after the exposure processing is applied to the substrate W in the exposure device 17, the cleaning processing to the substrate W is performed in the cleaning/drying processing group 80 of the cleaning/drying processing block 15. In this case, even if particles and the like in the atmosphere adheres to the substrate W to which a liquid adheres during the exposure processing, the attachment can be removed. This prevents contamination of the substrate W.

Furthermore, the drying processing of the substrate W after the exposure processing is performed in the cleaning/drying processing group 80. This prevents the liquid adhering to the substrate W after the exposure processing from dropping in the substrate processing apparatus 500. As a result, this prevents operational troubles such as abnormalities in the electric system of the substrate processing apparatus 500.

Moreover, drying the substrate W after the exposure processing prevents particles and the like in the atmosphere from adhering to the substrate W after the exposure processing, thereby preventing the substrate W from being contaminated.

Since the substrate W to which a liquid adheres is prevented from being transported, it is possible to prevent the liquid adhering to the substrate W during the exposure processing from influencing the atmosphere in the substrate processing apparatus 500. This facilitates the adjustment of the temperature and humidity in the substrate processing apparatus 500.

Furthermore, since the liquid adhering to the substrate W during the exposure processing is prevented from adhering to the indexer robot IR and the central robots CR1 to CR7, the liquid is prevented from adhering to the substrate W before the exposure processing. This prevents particles and the like in the atmosphere from adhering to the substrate W before the exposure processing, thereby preventing the contamination of the substrate W. Consequently, this prevents degradation in the resolution performance during the exposure processing and ensures prevention of contamination in the exposure device 17.

As a result of the foregoing, prevention of processing defects in the substrate W can be ensured.

Note that the configuration for performing the drying processing on the substrate W after the exposure processing is not limited to the example of the substrate processing apparatus 500 in FIG. 1. Instead of providing the cleaning/drying processing block 15 between the resist cover film removal block 14 and the interface block 16, it may be possible to provide the cleaning/drying processing group 80 in the interface block 16 and apply the drying processing to the substrate W after the exposure processing.

(6-b) Effects of Drying Processing of the Substrate after Exposure Processing

The cleaning/drying processing unit SD applies the drying processing to the substrate W by spraying the inert gas onto the substrate W from the center to the peripheral portion thereof while rotating the substrate W. This ensures that the cleaning liquid and the rinse liquid are removed from the substrate W, which reliably prevents the attachment of particles and the like in the atmosphere on the cleaned substrate W. It is thus possible to reliably prevent the contamination of the substrate W and the generation of dry marks on the main surface of the substrate W.

(6-c) Effects of the Cleaning/Drying Processing Block

Since the substrate processing apparatus 500 according to this embodiment has the configuration in which the cleaning/drying processing block 15 is added to an existing substrate processing apparatus, processing defects of the substrate W can be prevented at a lower cost.

(6-d) Effects of Provision of the Placement/Cooling Unit P-CP

As described above, the placement/cooling unit P-CP having the function of placement of the substrate W before the exposure processing by the exposure device 17 and the function of cooling the substrate W for adjusting the temperature of the substrate W to the temperature in the exposure device 17 is provided, thereby making it possible to reduce the transporting processes. When the exposure processing is performed by the liquid immersion method in which strict temperature control of the substrate is required, the reduction of the transporting processes is useful.

As a result of the above-mentioned, throughput can be improved and reliability can be also improved since access points for transport can be reduced.

In particular, two placement/cooling units P-CP are provided, thereby further making it possible to improve the throughput. A part of the transporting process of the substrate W according to this embodiment is described below.

Figure 8:
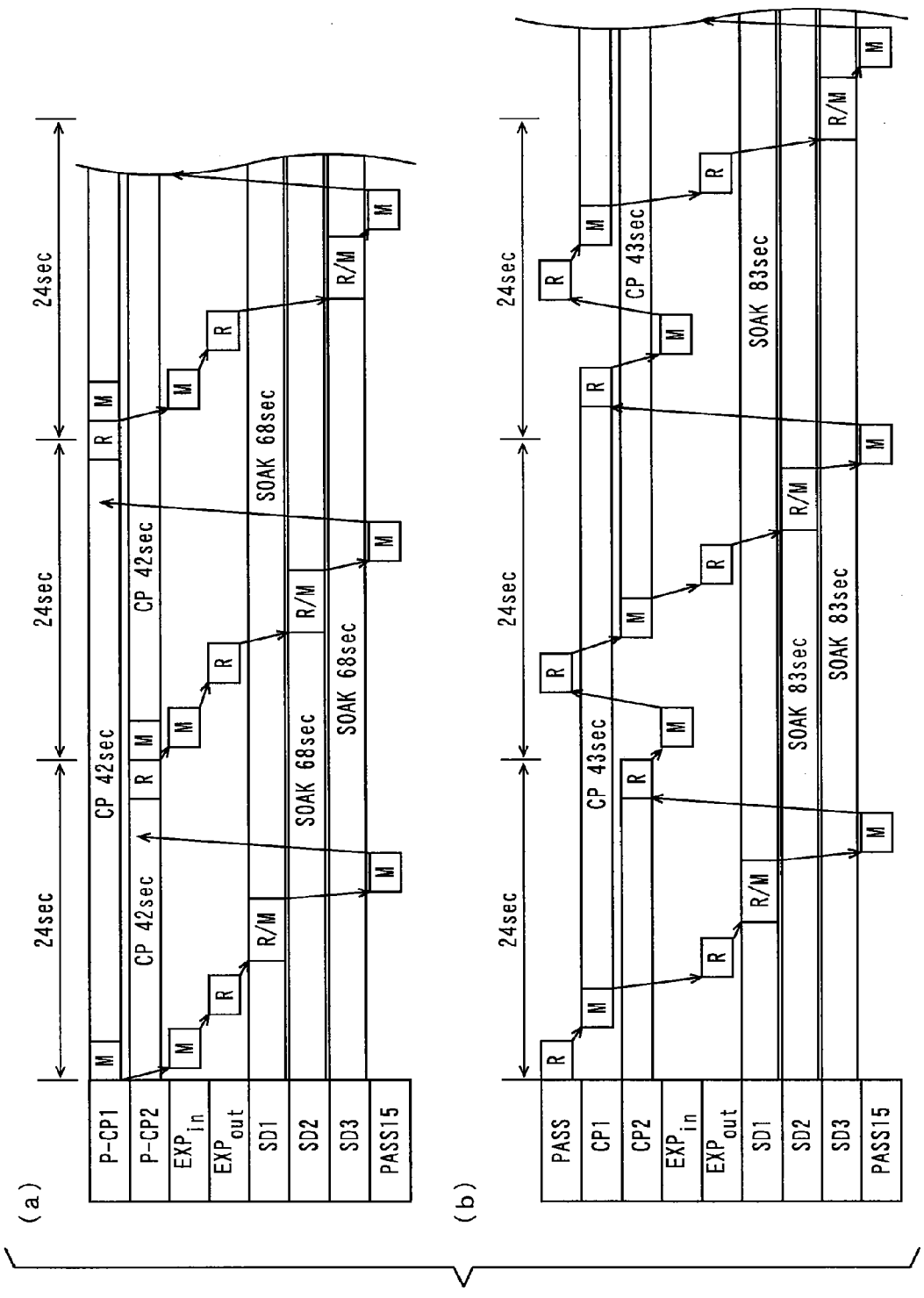
FIG. 8 is a diagram showing the comparison in processing time of the case of providing a placement/cooling unit according to the embodiment and the case of providing a substrate platform (for sending) and a cooling unit separately.

FIG. 8 is a diagram showing the comparison in processing time of the case of providing the placement/cooling unit P-CP according to the embodiment and the case of providing the substrate platform (for sending) (shown as PASS in FIG. 8) and the cooling unit separately. Note that FIG. 8(a) shows an example of the placement/cooling unit P-CP that serves as a substrate platform and a cooling unit, and FIG. 8(b) shows an example in which the substrate platform and the cooling unit are separately provided.

Furthermore, in FIGS. 8(a) and 8(b), for simplification, placing and carrying in the substrate are indicated by "M" and receiving and carrying out the substrate are indicated by "R", and to distinguish the processing units, the first and second placement/cooling units are indicated by "P-CP1, P-CP2", respectively, the first to third cleaning/drying processing units are indicated by "SD1 to SD3", respectively and the first and second cooling units are indicated by "CP1, CP2", respectively.

As shown in FIG. 8(a), a substrate W is carried into the first placement/cooling unit P-CP1 by the seventh central robot CR7. Next, the substrate W in the first placement/cooling unit P-CP1 is carried into an inlet (shown as EXPin in FIG. 8) of the exposure device 17 by the hand H1 of the interface transport mechanism IFR.

A substrate W after the exposure processing is subsequently received at an outlet (shown as EXPout in FIG. 8) of the exposure device 17 by the above-mentioned hand H2 of the interface transport mechanism IFR.

Next, a preceding substrate W after the cleaning and drying processing in the first cleaning/drying processing unit SD1 is received by the hand H1 of the interface transport mechanism IFR and the above-mentioned substrate W after the exposure processing is carried into the first cleaning/drying processing unit SD1 by the hand H2 of the interface transport mechanism IFR.

After that, the above-mentioned preceding substrate W after the cleaning and drying processing received by the hand H1 of the interface transport mechanism IFR is transferred onto the substrate platform PASS15.

Meanwhile, a substrate W carried into the second placement/cooling unit P-CP2 by the seventh central robot CR7 is carried into the inlet of the exposure device 17 by the hand H1 of the interface transport mechanism IFR.

Then, a substrate W after the exposure processing is received at the outlet of the exposure device 17 by the hand H2 of the interface transport mechanism IFR.

Next, a preceding substrate W after the cleaning and drying processing in the second cleaning/drying processing unit SD2 is received by the hand H1 of the interface transport mechanism IFR and the above-mentioned substrate W after the exposure processing is carried into the second cleaning/drying processing unit SD2 by the hand H2 of the interface transport mechanism IFR.

After that, the above-mentioned preceding substrate W after the cleaning and drying processing received by the hand H1 of the interface transport mechanism IFR is transferred onto the substrate platform PASS15.

In the meantime, a substrate W carried into the first placement/cooling unit P-CP1 by the seventh central robot CR7 is carried into the inlet of the exposure device 17 by the hand H1 of the interface transport mechanism IFR.

The substrate W after the exposure processing is subsequently received at the outlet of the exposure device 17 by the hand H2 of the interface transport mechanism IFR.

Next, a preceding substrate W after the cleaning and drying processing in the third cleaning/drying processing unit SD3 is received by the hand H1 of the interface transport mechanism IFR and the above-mentioned substrate W after the exposure processing is carried into the third cleaning/drying processing unit SD3 by the hand H2 of the interface transport mechanism IFR.

After that, the above-mentioned preceding substrate W after the cleaning and drying processing received by the hand H1 of the interface transport mechanism IFR is transferred onto the substrate platform PASS15.

The single processing cycle as described above is repeated at an interval of less than 72 seconds, for example, approximately 66 seconds, and the processing is performed by using the first and second placement/cooling units P-CP1, P-CP2 alternatively.

As shown in FIG. 8(a), the cooling processing time per substrate W by the first and second placement/cooling units P-CP1, P-CP2 is 42 seconds, respectively, for example, the cleaning and drying processing time per substrate W by the first to third cleaning/drying processing units SD1 to SD3 is 68 seconds, respectively, for example.

Next, the case of providing the substrate platform PASS and the cooling unit CP separately is described.

As shown in FIG. 8(b), a substrate W is transferred to the substrate platform PASS (for sending) by the seventh central robot CR7. Next, the substrate W in the above-mentioned substrate platform PASS is carried into the first cooling unit CP1 by the hand H1 of the interface transport mechanism IFR.

A preceding substrate W after the exposure processing by the exposure device 17 is subsequently received at the outlet of the exposure device 17 by the hand H2 of the interface transport mechanism IFR.

In addition, a preceding substrate W after the cleaning and drying processing in the first cleaning/drying processing unit SD1 is received by the hand H1 of the interface transport mechanism IFR and the above-mentioned preceding substrate W after the exposure processing is carried into the first cleaning/drying processing unit SD1 by the hand H2 of the interface transport mechanism IFR.

After that, the above-mentioned preceding substrate W after the cleaning and drying processing received by the hand H1 of the interface transport mechanism IFR is transferred to the substrate platform PASS15.

Meanwhile, a substrate W transferred to and cooled by the second cooling unit CP2 is received by the hand H1 of the interface transport mechanism IFR and then carried into the inlet of the exposure device 17.

Next, a substrate W newly transferred to the substrate platform PASS by the seventh central robot CR7 is received by the hand H1 of the interface transport mechanism IFR and then carried into the second cooling unit CP2.

The above-mentioned substrate W carried into the inlet of the exposure device 17 and subjected to the exposure processing is subsequently received at the outlet of the exposure device 17 by the hand H2 of the interface transport mechanism IFR.

Furthermore, a preceding substrate W after the cleaning and drying processing in the second cleaning/drying processing unit SD2 is received by the hand H1 of the interface transport mechanism IFR and the above-mentioned substrate W after the exposure processing is carried into the second cleaning/drying processing unit SD2 by the hand H2 of the interface transport mechanism IFR.

After that, the above-mentioned preceding substrate W after the cleaning and drying processing received by the hand H1 of the interface transport mechanism IFR is transferred onto the substrate platform PASS15.

In the meantime, the above-mentioned substrate W cooled by the first cooling unit CP1 is received by the hand H1 of the interface transport mechanism IFR and then carried into the inlet of the exposure device 17.

Next, the substrate W newly transferred to the substrate platform PASS by the seventh central robot CR7 is received by the hand H1 of the interface transport mechanism IFR and then carried into the first cooling unit CP1.

The above-mentioned substrate W carried into the inlet of the exposure device 17 and subjected to the exposure processing is subsequently received at the outlet of the exposure device 17 by the hand H2 of the interface transport mechanism IFR.

Moreover, a preceding substrate W after the cleaning and drying processing in the third cleaning/drying processing unit SD3 is received by the hand H1 of the interface transport mechanism IFR and the above-mentioned substrate W after the exposure processing is carried into the third cleaning/drying processing unit SD3 by the hand H2 of the interface transport mechanism IFR.

After that, the above-mentioned preceding substrate W after the cleaning and drying processing received by the hand H1 of the interface transport mechanism IFR is transferred onto the substrate platform PASS15.

The single processing cycle as described above is repeated at an interval of more than 72 seconds, for example, approximately 80 seconds. As shown in FIG. 8(b), the cooling processing time per substrate W by the first and second cooling units CP1, CP2 is 43 seconds, respectively, for example, the cleaning and drying processing time per substrate W by the first to third cleaning/drying processing units SD1 to SD3 is 83 seconds, respectively, for example.

In this way, it is shown that the first and second placement/cooling units P-CP1, P-CP2 that serve as the substrate platform PASS (for sending) and the cooling unit CP are provided, thereby improving throughput drastically.

(6-e) Effects of Hydrophobic Processing

In the substrate processing apparatus 500 according to this embodiment, the hydrophobic processing is performed on the surface of the resist cover film on the substrate W by the hydrophobic processing unit HYP, thereby preventing liquid from soaking into the resist film and the resist cover film during the exposure processing in the exposure device 17. As a result, the generation of pattern defects is prevented in the process of post-exposure bake and development processing after exposure processing, so that the decrease in yield is suppressed.

(6-f) Effects of the Hydrophobic Processing Unit HYP

In the hydrophobic processing unit HYP according to this embodiment, the hydrophobic processing is performed on the surface of the resist cover film on the substrate W by supplying a vaporized hydrophobic material in the liquid storage tank 212 to the substrate W. Thus, the influence on the resist film and the resist cover film on the substrate W is reduced, as compared with that in a case of using a liquid hydrophobic material. This prevents the degradation in photosensitivity of the resist film and in function of avoiding elution of the resist cover film. The function of avoiding elution of the resist cover film is described below.

A vaporized hydrophobic material is supplied to the substrate W through a plurality of holes of the current plate 210 fixed to the supporting member 207. This causes the hydrophobic material to be dispersed uniformly on the resist cover film on the substrate W.

In addition, when the vaporized hydrophobic material is supplied to the substrate W, the carry-in/out opening 209 of a cover 206 is closed by a shutter 218 and the hydrophobic material in the cover 206 is exhausted by the exhausting device 211b. This prevents the hydrophobic material from leaking out from the hydrophobic processing unit HYP.

Furthermore, the temperature of the substrate W during the hydrophobic processing is kept at 23° C. (room temperature) to 150° C. This ensures adhesion of the hydrophobic material to the surface of the resist cover film without degrading the optical sensitivity of the resist film.

(6-g) Effects of Coating Processing of the Resist Cover Film

Before the exposure processing is performed on the substrate W in the exposure device 17, the resist cover film is formed on the resist film in the resist cover processing block 13. In this case, even if the substrate W is brought into contact with a liquid in the exposure device 17, the resist cover film prevents the contact of the resist film with the liquid, which prevents a component from being eluted in the liquid.

(6-h) Effects of Removal Processing of the Resist Cover Film

Before development processing is applied to the substrate W in the development processing block 12, resist cover removal processing is performed in the resist cover removal block 14. In this case, the resist cover film is reliably removed before the development processing, which allows the development processing to be reliably performed.

(7) Other Effects (7-a) Cleaning Processing of Substrates Before Exposure Processing In the substrate processing apparatus 500 according to this embodiment, cleaning processing to the substrate W may be performed before the exposure processing. In this case, cleaning and drying processing to the substrate W before the exposure processing is performed in the cleaning/drying processing group 80 in the cleaning/drying processing block unit 15, for example. This enables the removal of the particles and the like adhering to the substrate W before the exposure processing. Consequently, contamination in the exposure device 17 can be avoided.

Furthermore, the drying processing of the substrate W is performed in the cleaning/drying processing group 80 after the cleaning processing. This removes the cleaning liquid or the rinse liquid adhering to the substrate W during the cleaning processing, which prevents the particles and the like in the atmosphere from adhering to the substrate W after the cleaning processing again. As a result, contamination in the exposure device 17 can be reliably prevented.

Before the exposure processing is applied to the substrate W in the exposure device 17 after the formation of the resist cover film, the cleaning processing to the substrate W is performed in the cleaning/drying processing group 80. At this time, part of a component of the resist cover film formed on the substrate W is eluted in the cleaning liquid. Even if the substrate W is brought into contact with the liquid in the exposure device 17, the component of the resist cover film is prevented from being eluted in the liquid.

As a result of the foregoing, contamination in the exposure device 17 can be reliably prevented while the component of the resist film and the resist cover film are prevented from remaining on the main surface of the substrate W. This surely prevents processing defects of the substrate W from being generated.

Moreover, cleaning and drying processing of the substrate W may be performed by providing the cleaning/drying processing group 80 in the interface block 16.

(7-b) Resist Cover Film Processing Block

In the case of performing cleaning processing to the substrate W before exposure processing, the resist cover film processing block 13 may not be provided. In this case, part of a component of the resist is eluted into the cleaning liquid during the cleaning processing in the cleaning/drying processing group 80 in which the cleaning processing to the substrate W is performed before the exposure processing. Even if the resist film is brought into contact with the liquid in the exposure device 17, the component of the resist is prevented from being eluted into the liquid. As a result, contamination in the exposure device 17 can be prevented.

In the case of applying cleaning processing to the substrate W before exposure processing, the resist cover film processing block 13 may not be provided. In this case, the resist cover film removal block 14 is not needed.

Furthermore, where the resist cover film processing block 13 is not provided, the hydrophobic processing unit HYP is provided in at least one of the resist film processing block 11 and the development processing block 12. In this case, hydrophobic processing is applied to the surface of the resist film on the substrate W by the hydrophobic processing unit HYP.

This prevents a liquid from soaking into the resist film during exposure processing in the exposure device 17.

These can reduce the footprint of the substrate processing apparatus 500.

Note that this embodiment describes the case where the film made of a hydrophobic material is not formed on the resist cover film when the hydrophobic processing is applied to the surface of the resist cover film on the substrate W by the hydrophobic processing unit HYP.

In the case where the film made of a hydrophobic material is formed on the resist cover film, the film made of the hydrophobic material and the resist cover film are removed simultaneously in the resist cover film removal processing group 70a or the resist cover film removal processing group 70b in the resist cover film removal block 14. This ensures the development processing after the exposure processing.

Moreover, in the case where the cleaning processing to the substrate W is performed before exposure processing and the resist cover film processing block 13 and the resist cover film removal block 14 are not provided, the hydrophobic processing is applied to the surface of the resist film on the substrate W. Where the film made of a hydrophobic material is formed on the resist film by the hydrophobic processing, the removal unit for the film made of the hydrophobic material may be provided in at least one of the cleaning/drying processing block 15 and the development processing block 12. This causes the removal processing of the film made of the hydrophobic material formed on the resist film of the substrate W to be performed, which ensures the development processing after the exposure processing.

(7-c) Effects of the Cleaning/Drying Processing Unit

As mentioned above, since the drying processing of the substrate W is performed by spraying the inert gas from the center of the substrate W to its peripheral portion while rotating the substrate W in the cleaning/drying processing unit SD, the cleaning liquid and the rinse liquid can be reliably removed.

This can reliably prevent the components of the resist film and the resist cover film from being eluted into the cleaning liquid and the rinse liquid remaining on the substrate W when the substrate W is transported from the cleaning/drying processing group 80 to the development processing group 50. This can prevent the deformation of exposure patterns formed on the resist film. As a result, degradation in accuracy of line-width during the development processing is reliably prevented.

(7-d) Water-Resistant Substrate Processing Apparatus

If the substrate processing apparatus 500 has sufficient waterproofing function, the cleaning/drying processing group 80 may not be provided. This causes the footprint of the substrate processing apparatus 500 to be reduced. In addition, since transporting the substrate W to the cleaning/drying processing group 80 after the exposure processing is omitted, the productivity of the substrate W is improved.

(7-e) Effects of Hands of Robots

In the first to fifth central robots CR1 to CR5 and the indexer robot IR, the upper hand is used for transporting the substrate W before the exposure processing while the lower hand is used for transporting the substrate W after the exposure processing. This can reliably prevent a liquid from adhering to the substrate W before the exposure processing.

(8) Other Examples of the Cleaning/Drying Processing Unit

Moreover, although the cleaning/drying processing unit SD shown in FIG. 5 includes the nozzle 650 for cleaning processing and the nozzle 670 for drying processing separately, the nozzle 650 and the nozzle 670 may also be formed integrally, as shown in FIG. 9. This obviates the need to move each of the nozzle 650 and the nozzle 670 separately during the cleaning and drying processing to the substrate W, thereby simplifying the driving mechanism.

A nozzle 770 for drying processing shown in FIG. 10 may be used instead of the nozzle 670 for drying processing shown in FIG. 5.

The nozzle 770 shown in FIG. 10 extends vertically downward and also has branch pipes 771, 772 that extend obliquely downward from the sides thereof. A gas discharge port 770a is formed at the lower end of the branch pipe 771, a gas discharge port 770b at the lower end of the nozzle 770, and a gas discharge port 770c at the lower end of the branch pipe 772, each for discharging an inert gas.

The discharge port 770b discharges an inert gas vertically downward, and the discharge ports 770a, 770c each discharge an inert gas obliquely downward, as indicated by the arrows in FIG. 10. That is to say, the nozzle 770 discharges the inert gas so as to increase the spraying area downwardly.

Now, a cleaning/drying processing unit SD using the nozzle 770 for drying processing applies drying processing to the substrate W as will be described below.

Figure 11:
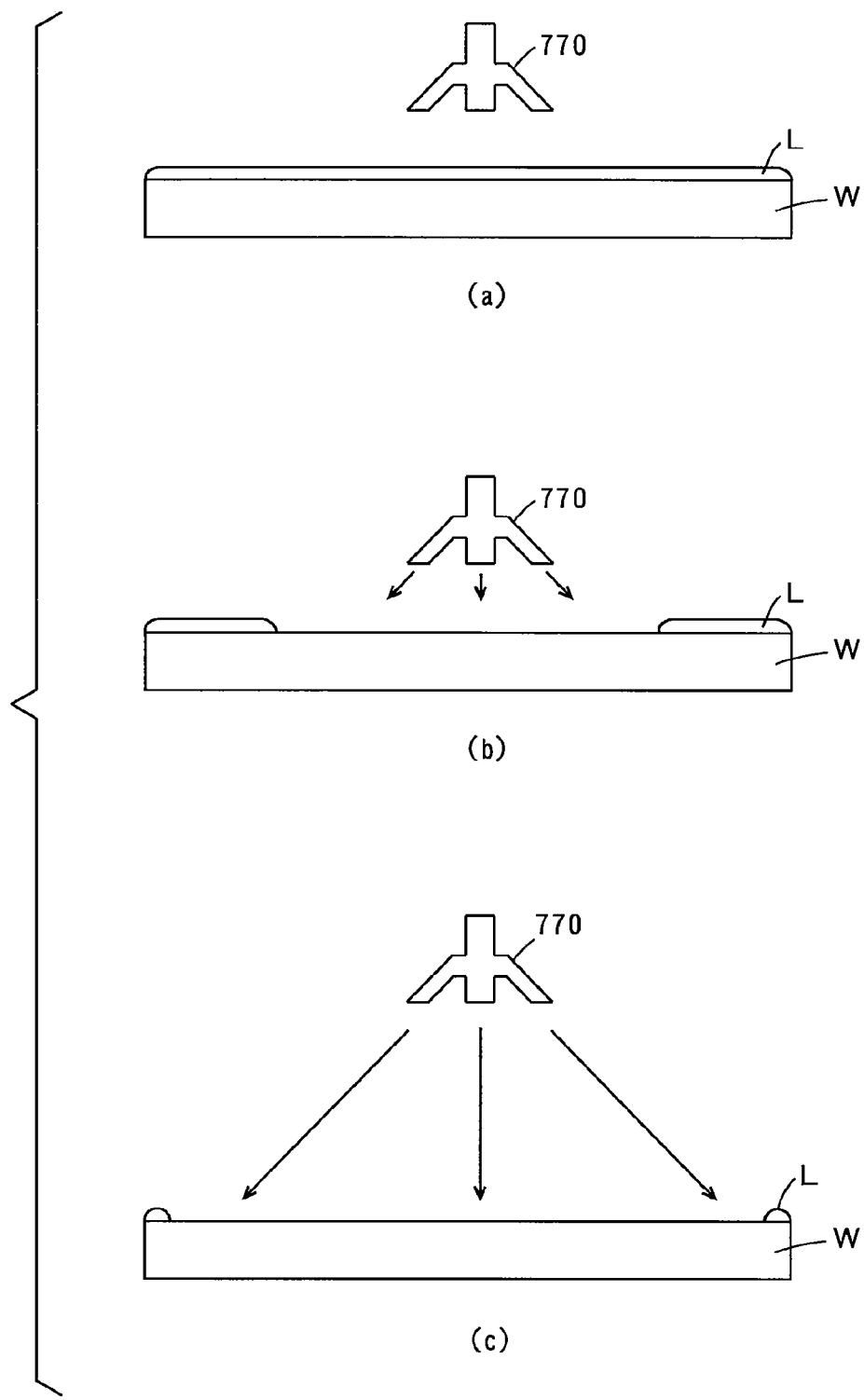
FIG. 11 is a diagram for in illustrating the drying processing method for the case of using the nozzle for drying processing in FIG. 10.

FIG. 11 is a diagram for use in illustrating a method of applying drying processing to the substrate W using the nozzle 770.

Figure 6:
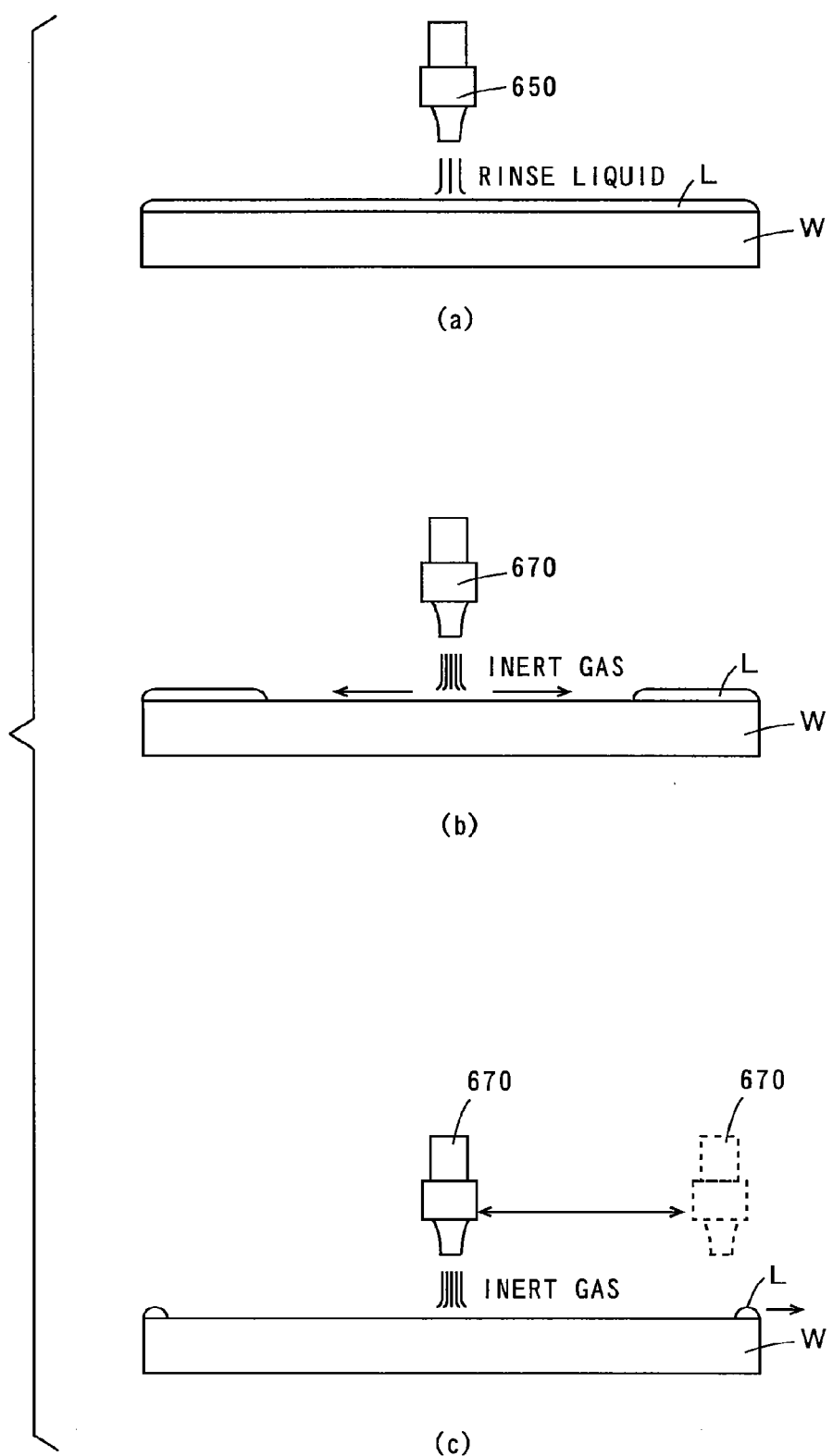
FIG. 6 is a diagram for use in illustrating the operation of the cleaning/drying processing unit.

Initially, a liquid layer L is formed on a surface of the substrate W by the method as described in FIG. 6, and then the nozzle 770 moves above the center of the substrate W, as shown in FIG. 11(a).

After this, an inert gas is discharged from the nozzle 770. This causes the rinse liquid on the center of the substrate W to move to the peripheral portion of the substrate W, leaving the liquid layer L only on the peripheral portion of the substrate W, as shown in FIG. 11(b). At the time, the nozzle 770 is brought close to the surface of the substrate W so as to reliably move the rinse liquid present on the center of the substrate W.

Next, as the number of revolutions of the rotation shaft 625 (see FIG. 5) increases, the nozzle 770 moves upward as shown in FIG. 11(c). This causes a great centrifugal force acting on the liquid layer L on the substrate W while increasing the area to which the inert gas is sprayed on the substrate W. As a result, the liquid layer L on the substrate W can be reliably removed. Note that the nozzle 770 can be moved up and down by lifting and lowering the second rotation shaft 672 via a rotation shaft lifting mechanism (not shown) provided to the second rotation shaft 672 in FIG. 5.

Alternatively, a nozzle 870 for drying processing as shown in FIG. 12 may be used instead of the nozzle 770. The nozzle 870 in FIG. 12 has a discharge port 870a whose diameter gradually increases downward.

This discharge port 870a discharges an inert gas vertically downward and obliquely downward as indicated by the arrows in FIG. 12. That is, similarly to the nozzle 770 in FIG. 10, the nozzle 870 discharges the inert gas so as to increase the spraying area downwardly. Consequently, drying processing similar to that using the nozzle 770 can be applied to the substrate W using the nozzle 870.

Figure 13:
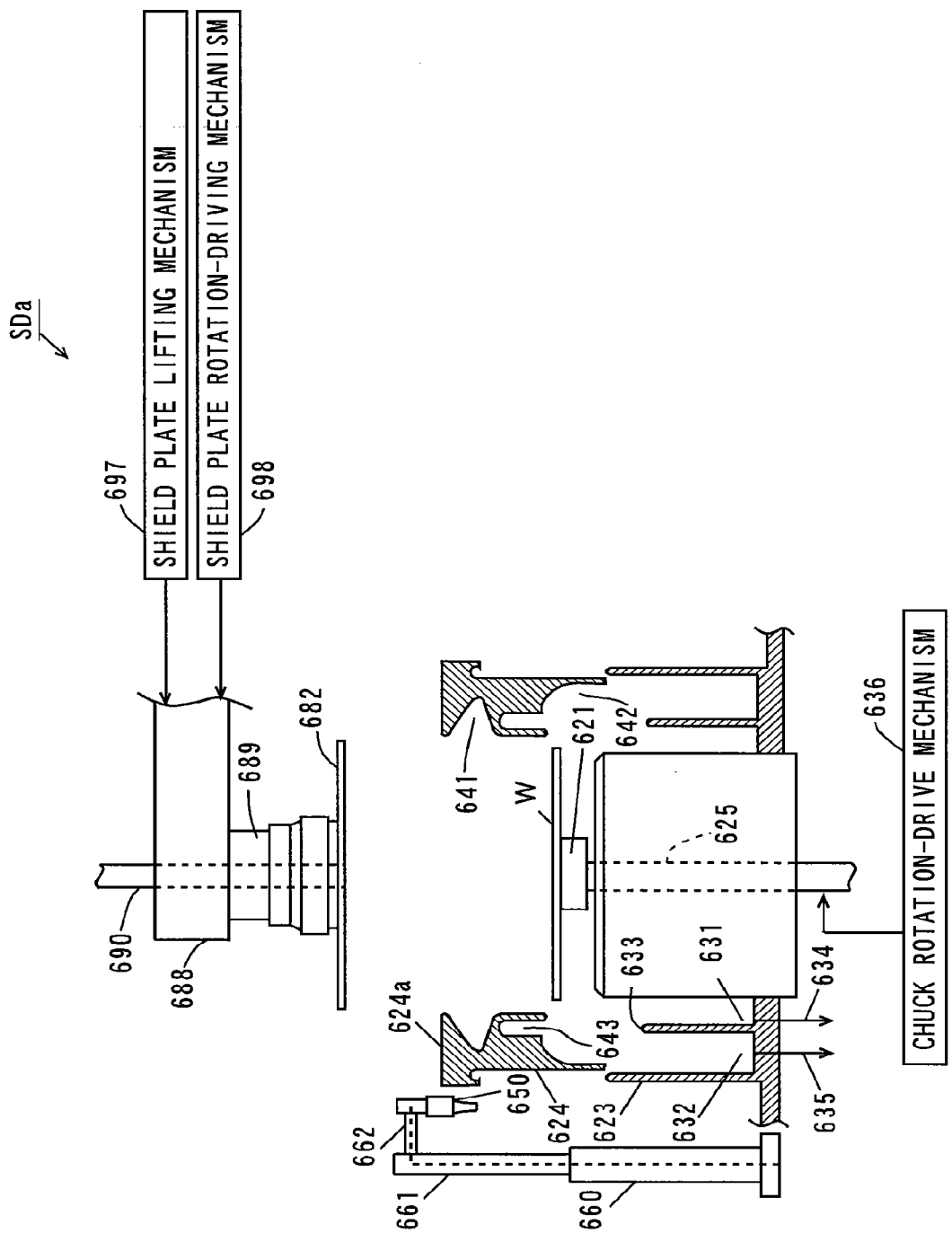
FIG. 13 is a schematic diagram showing another example of the cleaning/drying processing unit.

A cleaning/drying processing unit SDa as shown in FIG. 13 may also be used instead of the cleaning/drying processing unit SD shown in FIG. 5.

The cleaning/drying processing unit SDa in FIG. 13 is different from the cleaning/drying processing unit SD in FIG. 5 as described below.

The cleaning/drying processing unit SDa in FIG. 13 includes above the spin chuck 621 a disk-shaped shield plate 682 having an opening through the center thereof. A support shaft 689 extends vertically downward from around an end of an arm 688, and the shield plate 682 is mounted at a lower end of the support shaft 689 so as to oppose the top surface of the substrate W held on the spin chuck 621.

A gas supply passage 690 that communicates with the opening of the shield plate 682 is inserted into the inside of the support shaft 689. A nitrogen gas, for example, is supplied into the gas supply passage 690.

The arm 688 is connected with a shield plate lifting mechanism 697 and a shield plate rotation-driving mechanism 698. The shield plate lifting mechanism 697 lifts and lowers the shield plate 682 between a position close to the top surface of the substrate W held on the spin chuck 621 and a position upwardly away from the spin chuck 621.

During the drying processing to the substrate W in the cleaning/drying processing unit SDa in FIG. 13, with the shield plate 682 brought close to the substrate W as shown in FIG. 14, an inert gas is supplied to clearance between the substrate W and the shield plate 682 from the gas supply passage 690. This allows the inert gas to be efficiently supplied from the center of the substrate W to the peripheral portion thereof, thereby ensuring the removal of the liquid layer L on the substrate W.

(Correspondence Between Each Constituent Element of the Claims and Each Part of the Embodiments)

According to the embodiment, the indexer block 9, the anti-reflection film processing block 10, the resist film processing block 11, the development processing block 12, the resist cover film processing block 13, the resist cover film removal block 14 and the cleaning/drying processing block 15 correspond to the processing section, the interface block 16 corresponds to the interface, and the placement/cooling unit P-CP corresponds to the temperature control waiting unit and the substrate platform.

In addition, according to the embodiment, the resist film corresponds to the photosensitive film, the coating unit RES corresponds to the photosensitive film formation unit, the resist cover film corresponds to the protective film, the coating unit COV corresponds to the protective film formation unit, the coating unit BARC corresponds to the anti-reflection film formation unit, the cleaning/drying processing unit SD corresponds to the drying processing unit, the thermal processing groups 150, 151 for post-exposure bake correspond to the thermal processing unit, the interface transport mechanism IFR corresponds to the first transport device, the sixth central robot CR6 corresponds to the second transport device, and the hands H1, H2 of the interface transport mechanism IFR correspond to the first and second holders of the first transport device respectively.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A method of processing a substrate in a substrate processing apparatus that is arranged adjacent to an exposure device and includes a photosensitive film formation unit, a cleaning-drying processing unit, a thermal processing unit, and a development processing unit, the method comprising the steps of:

forming a photosensitive film made of photosensitive material on an upper surface of the substrate by the photosensitive film formation unit before exposure processing by the exposure device;

transporting the substrate after the formation of the photosensitive film by the photosensitive film formation unit to the exposure device;

transporting the substrate after the exposure processing by the exposure device from the exposure device to the cleaning-drying processing unit;

rotating the substrate after the exposure processing about a vertical axis while holding the substrate substantially horizontally in the cleaning-drying processing unit;

supplying a cleaning liquid onto the photosensitive film formed on the upper surface of the substrate being rotated in the cleaning-drying processing unit;

forming a liquid layer of the cleaning liquid having an upper surface that is exposed to atmosphere and in a free state, on the photosensitive film formed on the upper surface of the substrate by adjusting a rotation speed of the substrate in the cleaning-drying processing unit, the liquid layer of the cleaning liquid being formed to cover the entire upper surface of the substrate;

stopping the supply of the cleaning liquid after forming the liquid layer of the cleaning liquid;

supplying an inert gas from a nozzle for drying processing to a center of the liquid layer on the photosensitive film on the substrate such an opening is formed at the center of the liquid layer on the photosensitive film on the substrate, and the opening is enlarged with the liquid layer maintaining an annular shape in the cleaning-drying processing unit while the upper surface of the liquid layer on the photosensitive film on the substrate is exposed to atmosphere and is in a free state, after the supply of the cleaning liquid is stopped, the opening formed in the liquid layer being enlarged by a centrifugal force without the nozzle for drying processing being moved;

removing the liquid layer on the photosensitive film on the substrate by increasing the rotation speed of the substrate after the opening formed in the liquid layer is enlarged such that the liquid layer is present only on a peripheral portion of the substrate;

transporting the substrate after the removal of the liquid layer by the cleaning- drying processing unit from the cleaning-drying processing unit to the thermal processing unit;

applying thermal processing to the substrate after the removal of the liquid layer by the thermal processing unit; and applying development processing by the development processing unit to the substrate after the thermal processing.

2. The substrate processing method according to claim 1 wherein:

the substrate processing apparatus further includes first and second transport devices;

the step of transporting the substrate after the exposure processing from the exposure device to the cleaning-drying processing unit comprises the step of transporting the substrate from the exposure device to the cleaning-drying processing unit by the first transport device; and the step of transporting the substrate after the drying processing from the cleaning-drying processing unit to the thermal processing unit comprises the step of transporting the substrate from the cleaning-drying processing unit to the thermal processing unit by the second transport device.

3. The substrate processing method according to claim 2 wherein:

the first transport device includes first and second holders that hold the substrate;

the step of transporting the substrate after the formation of the photosensitive film to the exposure device comprises the step of holding the substrate by the first holder of the first transport device and transporting the substrate to the exposure device; and the step of transporting the substrate after the exposure processing from the exposure device to the cleaning-drying processing unit comprises the step of holding the substrate by the second holder of the first transport device and transporting the substrate from the exposure device to the cleaning-drying processing unit.

4. The substrate processing method according to claim 3 wherein:

the step of holding and transporting the substrate from the exposure device to the cleaning-drying processing unit comprises the step of holding and transporting the substrate by the second holder that is provided below the first holder.

5. The substrate processing method according to claim 2 wherein the substrate processing apparatus further includes a third transport device and a first platform;

the method further comprises the step of transporting the substrate after the formation of the photosensitive film and before the exposure processing to the first platform by the third transport device; and the step of transporting the substrate after the formation of the photosensitive film to the exposure device comprises the step of transporting the substrate from the first platform to the exposure device by the first transport device.

6. The substrate processing method according to claim 5 further comprising the step of keeping the substrate transported by the third transport device at a temperature that is substantially equal to a temperature within the exposure device.

7. The substrate processing method according to claim 1 wherein:

the substrate processing apparatus further includes a hydrophobic processing unit; and the method further comprises the step of applying hydrophobic processing to the substrate after the formation of the photosensitive film and before the exposure processing.

8. The substrate processing method according to claim 1 wherein:

the substrate processing apparatus further includes a protective film formation unit; and the method further comprises the step of forming a protective film for protecting the photosensitive film by the protective film formation unit after the formation of the photosensitive film and before the exposure processing.

9. The substrate processing method according to claim 8 wherein:

the substrate processing apparatus further includes a protective film removal unit; and the method further comprises the step of removing the protective film from the substrate after the thermal processing by the thermal processing unit.

10. The substrate processing method according to claim 1 wherein:

the substrate processing apparatus further includes an anti-reflection film formation unit; and the method further comprises the step of forming an anti-reflection film by the anti-reflection film formation unit on the substrate before the formation of the photosensitive film.

* * * * *